(12) United States Patent
Kurjanowicz

(10) Patent No.: US 8,023,338 B2
(45) Date of Patent: Sep. 20, 2011

(54) DUAL FUNCTION DATA REGISTER

(75) Inventor: Wlodek Kurjanowicz, Ottawa (CA)

(73) Assignee: Sidense Corp., Ottawa, Ontario (CA)

( * ) Notice: Subject to any disclaimer, the term of this patent is extended or adjusted under 35 U.S.C. 154(b) by 291 days.

(21) Appl. No.: 12/306,808

(22) PCT Filed: Dec. 20, 2007

(86) PCT No.: PCT/CA2007/002285

§ 371 (c)(1),
(2), (4) Date: Dec. 29, 2008

(87) PCT Pub. No.: WO2008/077238

PCT Pub. Date: Jul. 3, 2008

(65) Prior Publication Data

US 2009/0290434 A1    Nov. 26, 2009

Related U.S. Application Data

(60) Provisional application No. 60/871,519, filed on Dec. 22, 2006, provisional application No. 60/871,571, filed on Dec. 22, 2006.

(51) Int. Cl.
*G11C 7/10* (2006.01)
(52) U.S. Cl. .............................. 365/189.05; 365/230.08
(58) Field of Classification Search ............. 365/189.05, 365/230.08, 185.21, 205, 207
See application file for complete search history.

(56) References Cited

U.S. PATENT DOCUMENTS

| | | | |
|---|---|---|---|
| 5,257,223 A | 10/1993 | Dervisoglu | |
| 5,347,173 A | 9/1994 | McAdams | |
| 5,574,857 A | 11/1996 | Ramakrishnan | |
| 5,784,317 A | 7/1998 | Ha | |
| 5,996,043 A | 11/1999 | Manning | |
| 6,259,628 B1 | 7/2001 | Park | |
| 6,266,273 B1 | 7/2001 | Conley | |
| 6,365,421 B2 | 4/2002 | Debenham | |
| 6,373,771 B1 | 4/2002 | Fifield | |
| 6,400,593 B1 | 6/2002 | Lien | |
| 6,427,197 B1 * | 7/2002 | Sato et al. | 711/169 |
| 6,459,640 B1 | 10/2002 | Tani | |
| 6,564,237 B2 | 5/2003 | Ohashi | |

(Continued)

OTHER PUBLICATIONS

U.S. Appl. No. 12/306,940, Notice of Allowance dated Dec. 29, 2010.

(Continued)

*Primary Examiner* — Jason Lappas
(74) *Attorney, Agent, or Firm* — Shin Hung; Borden Ladner Gervais LLP

(57) ABSTRACT

A dual function serial and parallel data register with integrated program verify functionality. The master and slave latching circuits of the dual function data register can concurrently store two different words of data. In a program verify operation, the master latch stores program data and the slave latch will receive and store read data. Comparison logic in each register stage will compare the data of both latches, and integrate the comparison result to that of the previous register stage. The final single bit result will indicate the presence of at least one bit that has not been programmed. Automatic program inhibit logic in each stage will prevent successfully programmed bits from being re-programmed in each subsequent reprogram cycle. Either data word can be serially clocked out by selectively starting the shift operations on either the low or high active logic level of a clock signal.

23 Claims, 20 Drawing Sheets

U.S. PATENT DOCUMENTS

| | | |
|---|---|---|
| 6,728,155 B2 | 4/2004 | Yoshioka |
| 6,775,184 B1 | 8/2004 | Park et al. |
| 6,775,784 B1 | 8/2004 | Park |
| 7,170,782 B2 | 1/2007 | Conley |
| 7,215,138 B1 | 5/2007 | Kondapalli |
| 2005/0163277 A1 | 7/2005 | Georgakos et al. |
| 2005/0195653 A1 | 9/2005 | Conley et al. |
| 2005/0226078 A1 | 10/2005 | Ito et al. |
| 2007/0257331 A1 | 11/2007 | Kurjanowicz |
| 2010/0002527 A1 | 1/2010 | Kurjanowicz |

OTHER PUBLICATIONS

Canadian Patent Application No. 2,649,002: Office Action dated Apr. 14, 2009.

U.S. Appl. No. 12/442,274 Office Action dated May 13, 2011.

European Patent Application No. 07855567.9 Supplementary Search Reported, dated Dec. 15, 2009.

Canadian Patent Application No. 2,645,781: Office Action dated Feb. 3, 2009.

* cited by examiner

| Row 1 | 0 | 1 | 1 | 0 | 1 |
| Row 2 | 1 | 0 | 1 | 1 | 0 |

DUAL FUNCTION DATA REGISTER

CROSS REFERENCE TO RELATED APPLICATIONS

This application claims the benefit of priority of U.S. Provisional Patent Application No. 60/871,519 filed Dec. 22, 2006, and U.S. Provisional Patent Application No. 60/871, 571 filed Dec. 22, 2006, both of which are incorporated herein by reference in their entirety.

FIELD OF THE INVENTION

The invention is directed to non-volatile memories. More specifically, the invention is directed to data registers of non-volatile memories.

BACKGROUND OF THE INVENTION

Over the past 30 years, anti-fuse technology has attracted significant attention of many inventors, IC designers and manufacturers. An anti-fuse is a structure alterable to a conductive state, or in other words, an electronic device that changes state from not conducting to conducting. Equivalently, the binary states can be either one of high resistance and low resistance in response to electric stress, such as a programming voltage or current. There have been many attempts to develop and apply anti-fuses in microelectronic industry, but the most successful anti-fuse applications to date can be seen in FGPA devices manufactured by Actel and Quicklogic, and redundancy or option programming used in DRAM devices by Micron. Anti-fuse technology is well known in the art, and example anti-fuse transistors are shown in FIGS. 1 to 5b.

Anti-fuse memory is one type of one-time programmable (OTP) memory in which the device can be permanently programmed (electrically) with data once. This data is programmed by an end user for a particular application. There are several types of OTP memory cells which can be used. OTP memories provide users with a level flexibility since any data can be programmed.

Anti-fuse memory can be utilized in all one time programmable applications, including RF-ID tags. RF-ID tagging applications are gaining more acceptance in the industry, particularly in sales, security, transport, logistics, and military applications for example. The simplicity and full CMOS compatibility anti-fuse memory allows for application of the RF-ID tag concept to integrated circuit manufacturing and testing processes. Therefore, IC manufacturing productivity can be increased by utilizing anti-fuse memory in combination with an RF communication interface on every wafer and/or every die on the wafer allowing for contact-less programming and reading chip specific or wafer specific information during IC manufacturing and packaging, as well as during printed circuit board assembly.

FIG. 1 is a circuit diagram illustrating the basic concept of an anti-fuse memory cell, while FIGS. 2 and 3 show the planar and cross-sectional views respectively, of the anti-fuse memory cell shown in FIG. 1. The memory cell of FIG. 1 includes a pass, or access transistor 10 for coupling a bitline BL to a bottom plate of anti-fuse device 12. A wordline WL is coupled to the gate of access transistor 10 to turn it on, and a cell plate voltage Vcp is coupled to the top plate of anti-fuse device 12 for programming anti-fuse device 12.

It can be seen from FIGS. 2 and 3 that the layout of access transistor 10 and anti-fuse device 12 is very straight-forward and simple. The gate 14 of access transistor 10 and the top plate 16 of anti-fuse device 12 are constructed with the same layer of polysilicon, which extend across active area 18. In the active area 18 underneath each polysilicon layer, is formed a thin gate oxide 20, also known as a gate dielectric, for electrically isolating the polysilicon from the active area underneath. On either side of gate 14 are diffusion regions 22 and 24, where diffusion region 24 is coupled to a bitline. Although not shown, those of skill in the art will understand that standard CMOS processing, such as sidewall spacer formation, lightly doped diffusions (LDD) and diffusion and gate silicidation, can be applied. While the classical single transistor and capacitor cell configuration is widely used, a transistor-only anti-fuse cell is further desirable due to the semiconductor array area savings that can be obtained for high-density applications. Such transistor-only anti-fuses must be reliable while simple to manufacture with a low cost CMOS process.

FIG. 4a shows a cross-sectional view of an anti-fuse transistor that can be manufactured with any standard CMOS process. Variants of this anti-fuse transistor are disclosed in commonly owned U.S. patent application Ser. No. 11/762, 552, filed on Jun. 13, 2007, the contents of which are incorporated by reference. In the presently shown example, the anti-fuse transistor is almost identical to a simple thick gate oxide, or input/output MOS transistor with one floating diffusion terminal. The disclosed anti-fuse transistor, also termed a split-channel capacitor or a half-transistor, can be reliably programmed such that the fuse link between the polysilicon gate and the substrate can be predictably localized to a particular region of the device. The cross-section view of FIG. 4a is taken along the channel length of the device, which in the presently described example is a p-channel device.

Anti-fuse transistor 26 includes a variable thickness gate oxide 28 formed on the substrate channel region 30, a polysilicon gate 32, sidewall spacers 34, a field oxide region 36, a diffusion region 38 and an LDD region 40 in the diffusion region 38. A bitline contact 42 is shown to be in electrical contact with diffusion region 38. The variable thickness gate oxide 28 consists of a thick oxide and a thin gate oxide such that a portion of the channel length is covered by the thick gate oxide and the remaining portion of the channel length is covered by the thin gate oxide. Generally, the thin gate oxide is a region where oxide breakdown can occur. The thick gate oxide edge meeting diffusion region 38 on the other hand, defines an access edge where gate oxide breakdown is prevented and current between the gate 32 and diffusion region 38 is to flow for a programmed anti-fuse transistor. While the distance that the thick oxide portion extends into the channel region depends on the mask grade, the thick oxide portion is preferably formed to be at least as long as the minimum length of a high voltage transistor formed on the same chip.

In this example, the diffusion region 38 is connected to a bitline through a bitline contact 42, or other line for sensing a current from the polysilicon gate 32, and can be doped to accommodate programming voltages or currents. This diffusion region 38 is formed proximate to the thick oxide portion of the variable thickness gate oxide 28. To further protect the edge of anti-fuse transistor 26 from high voltage damage, or current leakage, a resistor protection oxide (RPO), also known as a salicide protect oxide, can be introduced during the fabrication process to further space metal particles from the edge of sidewall spacer 34. This RPO is preferably used during the salicidiation process for preventing only a portion of diffusion region 38 and a portion of polysilicon gate 32 from being salicided. It is well known that salicided transistors are known to have higher leakage and therefore lower breakdown voltage. Thus having a non-salicided diffusion region 38 will reduce leakage. Diffusion region 38 can be doped for low voltage transistors or high voltage transistors or a combination of the two resulting in same or different diffusion profiles.

A simplified plan view of the anti-fuse transistor 26 is shown in FIG. 4b. Bitline contact 42 can be used as a visual reference point to orient the plan view with the corresponding cross-sectional view of FIG. 4a. The active area 44 is the region of the device where the channel region 30 and diffusion region 38 are formed, which is defined by an OD mask during the fabrication process. The dashed outline 46 defines the areas in which the thick gate oxide is to be formed via an OD2 mask during the fabrication process. More specifically, the area enclosed by the dashed outline 46 designates the regions where thick oxide is to be formed. OD simply refers to an oxide definition mask that is used during the CMOS process for defining the regions on the substrate where the oxide is to be formed, and OD2 refers to a second oxide definition mask different than the first. Details of the CMOS process steps for fabricating anti-fuse transistor 26 will be discussed later. According to an embodiment of the present invention, the thin gate oxide area bounded by edges of the active area 44 and the rightmost edge of the OD2 mask, is minimized. In the presently shown embodiment, this area can be minimized by shifting the rightmost OD2 mask edge towards the parallel edge of active area 44. Previously mentioned U.S. patent application Ser. No. 11/762,552 describes alternate single transistor anti-fuse memory cells which can be used in a non-volatile memory array. Two transistor anti-fuse memory cells are known in the art, as shown in the example of FIGS. 5a and 5b.

FIG. 5b shows a planar view of a two-transistor anti-fuse memory cell 48 having a minimized thin gate oxide area that can be manufactured with any standard CMOS process, according to an embodiment of the present invention. FIG. 5a shows a cross-sectional view of the memory cell 48 of FIG. 5b, taken along line B-B. Two-transistor anti-fuse memory cell 48 consists of an access transistor in series with an anti-fuse transistor. The access transistor includes a polysilicon gate 50 overlying a thick gate oxide 52, which itself is formed over the channel 54. On the left side of the channel 54 is a diffusion region 56 electrically connected to a bitline contact 58. On the right side of the channel 54 is a common diffusion region 60 shared with the anti-fuse transistor. The anti-fuse transistor includes a polysilicon gate 62 overlying a thin gate oxide 64, which itself is formed over the channel 66. Dashed outline 68 represents the OD2 mask which defines the area where thick oxide is to be formed. The thick gate oxide 52 can correspond to that used for high voltage transistors while the thin gate oxide 64 can correspond to that used for low voltage transistors. It is well known that polysilicon gates 50 and 62 can be independently controlled, or alternatively can be connected to each other as shown in FIG. 5b. In the example of FIG. 5b, both polysilicon gates 50 and 62 are part of the same polysilicon structure, and connected to a wordline through wordline contact 70. Both diffusion regions 56 and 60 can have LDD regions, which can be identically doped or differently doped, depending on the desired operating voltages to be used. Commonly owned U.S. patent application Ser. No. 11/762,552 filed on Jun. 13, 2007 describes alternate two-transistor anti-fuse memory cells which can be used in a non-volatile memory array.

The programming speed of OTP memories is relatively slow, since each programming cycle will attempt to program a certain number of data words at the same time.

Following each programming cycle is a program verify cycle to ensure that the data words were successfully programmed. Any bits that do not pass the program verify step are reprogrammed. This process continues until all the memory cell states have been successfully programmed. FIG. 6a shows how an unprogrammed anti-fuse memory cell, such as anti-fuse transistor 26, is programmed. Anti-fuse transistor 26 has its gate terminal connected to a wordline WL and its single diffusion region connected to a bitline BL. Programming is effected by biasing the bitline to VSS and driving the wordline to a high voltage level VPP. VPP is selected based on the process technology and thickness of the thin gate oxide that is sufficient for forming a conductive link between the polysilicon gate and the channel region.

A successfully programmed anti-fuse transistor 26 is shown in FIG. 6b, where a conductive link 72 is formed between the polysilicon gate and the channel region. Conductive link 72 is schematically represented as a resistive connection between the wordline and the channel region under the thin gate oxide region of anti-fuse transistor 26. Therefore a programmed anti-fuse transistor having a conductive link stores one logic state of one bit of data. Accordingly, an unprogrammed anti-fuse transistor will by default store the other logic state of one bit of data. To prevent programming of the anti-fuse transistor 26, the bitline is biased to VDD while the wordline is driven to VPP. This will be sufficient for inhibiting the conductive link from forming.

Reading the anti-fuse transistor is achieved by driving the wordline to a read voltage VREAD, and by precharging the bitline to VSS, as shown in FIG. 7. If the anti-fuse transistor 26 has a conductive link 72, then the wordline will pull the bitline towards the VREAD voltage level via the conductive link 72 and the positive gate voltage of the anti-fuse transistor. This bitline voltage can be sensed and amplified by sense amplifier circuits. On the other hand, if the anti-fuse transistor 26 is not programmed, ie. does not have a conductive link 72, then the bitline will remain at approximately VSS.

Most electrically programmable non-volatile memories, such as Flash, EEPROM or anti-fuse memories, require the use of high voltages to program the memory cells. These high voltages are generated on chip and distributed to wordlines and/or bitlines during programming operations. Depending on the architecture of the memory, any number of words can be programmed simultaneously, where each word is made up of a predetermined number of bits. Assuming that the memory cells start in the unprogrammed state, logic 0 for example, only memory cells for storing a logic 1 state actually undergo programming. The number of logic 1 states to be programmed at the same time depends on the data to be programmed. Because a large number of bits may be programmed simultaneously, the finite on-chip high voltage generators may not have sufficient current to program all the selected memory cells. Hence, after a first program cycle, the cells subjected to programming must be verified to ensure that they were successfully programmed.

Verification is done by reading out the memory cells and comparing their stored logic states (logic 0 or 1) to the desired programmed state (logic 1 for example). If specific bits were not successfully programmed, as determined by the program verify cycle, then the programming cycle is repeated. However, there is no need to re-program cells which were successfully programmed. This is especially problematic for anti-fuse transistors. A programmed anti-fuse transistor has a conduction path formed between its wordline and its bitline, thus repeating a program cycle on such a cell will draw more current away from the cells where programming is still required. Hence, those memory cells must be excluded from the next programming cycle. This iterative program-verifyprogram sequence continues until every memory cell to be programmed has been deemed to be successfully programmed.

FIG. 8 is a block diagram of a simplified anti-fuse memory device of the prior art, illustrating the logic circuits required for implementing program verify operations. The anti-fuse memory device of FIG. 8 includes a memory array 80 consisting of anti-fuse memory cells, or other non-volatile memory cells, connected to wordlines and bitlines. Wordline drivers 82 apply the read and programming voltage levels to the wordlines, while column decoders and sense amplifiers 84 are coupled to the bitlines for sensing and multiplexing the sensed data to a data register 86. The data register 86 is primarily responsible for storing data to be programmed and for storing read data. The program-verify circuits include additional latch circuits, which can be a second data register 88, and comparison logic 90. In use program data P_DATA is received by data register 86, which is also stored in the second data register 88. Those skilled in the art will understand that other circuits required for proper operation of the memory device are intentionally omitted, in order to simplify the schematic.

Once a programming cycle has been completed, the data is read out from the memory cells being programmed, and stored in data register 86. The comparison logic 90 then compares each bit position of data registers 86 and 88 to each other. If all the bit positions match, meaning that each bit position was successfully programmed, then the status signal STATUS will have a logic level indicating that all bits were programmed. Otherwise, if just one bit position did not successfully program, then the status signal STATUS will have another logic level, indicating that at least one bit was not properly programmed. Then further program cycles are executed, while the successfully programmed bits are masked, or inhibited from further programming.

One of the main problems with this program verify scheme is that the circuit implementation consumes too much valuable circuit area. Mainly, a second data register is required for storing the program data, which will be very large if the word to be programmed is very wide. The logic required to disable successfully programmed bit positions can be complex, as can be the comparison logic used to detect the failed programming of at least one bit position. Those skilled in the art will understand that increased circuit area will directly impact the manufacturing cost of the device as more chip area is required per device.

It is, therefore, desirable to provide a program verify scheme that does not require a second data register, and can simplify program verification operations.

SUMMARY OF THE INVENTION

It is an object of the present invention to obviate or mitigate at least one disadvantage of prior OTP memories. More specifically, it is an object of the present invention provide a data register that can integrate program verify operations with data storage functionality.

In a first aspect, the present invention provides a data register stage. The data register stage includes a data storage circuit and a status circuit. The data storage circuit having a first latch and a second latch arranged in a master-slave flip-flop configuration for shifting in data serially from a serial input terminal and for shifting out data from a serial output terminal. The shifting operations are controlled by phase adjustable clock signals. The status circuit detects opposite logic states stored in the first latch and the second latch, and combines an output corresponding to the detected opposite logic states with a previous local status signal to provide a local status signal. The previous local status signal corresponds to detected opposite logic states stored in a previous data register stage. In an embodiment of the present aspect, the data storage circuit further includes a parallel data input circuit for coupling parallel data to an input of the first latch in response to a write signal, and a parallel data output terminal coupled to an output of the second latch. Further included is a program inhibit circuit for reversing the logic state stored in the first latch if the second latch stores a specific logic state. The program inhibit circuit includes a first transistor and a second transistor serially connected between a voltage supply and an input of the first latch. The first transistor gate receives an enable signal and the second transistor gate is coupled to an output of the second latch.

In another embodiment, the status circuit includes an XOR gate for comparing the logic state of the second latch to an inverted logic state of the first latch, and an AND gate for combining the XOR gate output with the previous local status signal to provide the local status signal. The status circuit will further detect matching logic states stored in the first latch and another first latch of the previous data register stage for providing a second local status signal. The status circuit includes an AND gate for combining the logic state of the first latch with a second previous local status signal corresponding to the logic state of a second first latch of the previous data register stage, for providing the second local status signal. In yet a further embodiment, the first latch output is coupled to a sense amplifier input and the second latch input is coupled to a sense amplifier output. The phase adjustable clock signals can include first and second clock signals generated by a clock controller in response to a source clock and an active logic level of a shift enable signal. The clock controller can include a first AND gate and a second AND gate. The first AND gate generates the first clock signal in response to the source clock and the active logic level of the shift enable signal. The second AND gate generates the second clock signal in response to an inverted source clock and the active logic level of the shift enable signal.

In a second aspect, the present invention provides a non-volatile memory device. The non-volatile memory device includes a memory array having non-volatile memory cells connected to wordlines and bitlines, bitline sense amplifiers, and a data register. The bitline sense amplifiers are coupled to the columns for biasing the bitlines in response to program data in a program operation, and sense a read voltage of the bitlines in a read operation to provide read data. The data register concurrently stores the program data and the read data, and compares the stored program data to the stored read data. The data register further provides a status signal corresponding to a successful program operation when the stored program data and the stored read data are opposite logic levels. In an embodiment of the present aspect, the data register includes a first register stage and a second register stage serially connected to each other for serially shifting one of the program data and the read data through a serial output port coupled to the second register stage. The first register stage and the second register stage can each include a data storage circuit and a status circuit. The data storage circuit has a first latch and a second latch arranged in a master-slave flip-flop configuration for shifting in data serially from a serial input terminal and for shifting out data from a serial output terminal. The shifting operations are controlled by phase adjustable clock signals. The status circuit detects opposite logic states stored in the first latch and the second latch, and combines an output corresponding to the detected opposite logic states with a previous local status signal to provide a local status signal. The previous local status signal corresponds to detected opposite logic states stored in a previous data register stage.

In yet a further embodiment, a clock controller is provided for generating the phase adjustable clock signals in response to a source clock and a shift enable signal. The program data is shifted out through the serial output port when the shift enable signal is activated while the source clock is at a first logic level, and the read data is shifted out through the serial output port when the shift enable signal is activated while the source clock is at a second logic level. The data storage circuit further includes a parallel data input circuit for coupling parallel data to an input of the first latch in response to a write signal, and a parallel data output terminal coupled to an output of the second latch.

According to another embodiment, the status circuit includes a data match circuit for detecting opposite logic states stored in the first latch and the second latch. The data match circuit includes an XOR gate and an AND gate. The XOR gate compares the logic state of the second latch to an inverted logic state of the first latch. The AND gate combines the XOR gate output with the previous local status signal to provide the local status signal. A program inhibit circuit is provided for changing the logic state stored in the first latch to a program inhibit logic state if the second latch stores read data corresponding to a successfully programmed memory cell. The status circuit includes a reprogram verify circuit for providing a second local status signal when the first latch and a previous second local status signal have logic states corresponding to the program inhibit logic state. The previous second local status signal is provided by the previous data register stage. In one aspect of the present embodiment, the data register includes program verify logic for providing the status signal corresponding to a successful program operation when the local status signal is at a logic level corresponding to the detected opposite logic states. In a second aspect of the present embodiment, the data register includes program verify logic for providing the status signal corresponding to a successful program operation when the second local status signal is at a logic level corresponding to the program inhibit logic state.

In yet a further aspect of the present embodiment, the data register can include program verify logic for providing the status signal corresponding to a successful program operation when the local status signal is at a logic level corresponding to the detected opposite logic states and the second local status signal is at a logic level corresponding to the program inhibit logic state. The program inhibit circuit can include a first transistor and a second transistor serially connected between a voltage supply and an input of the first latch, the first transistor gate receiving an enable signal and the second transistor gate being coupled to an output of the second latch. The reprogram verify circuit includes an AND gate for combining the logic state of the first latch with the previous second local status signal to provide the second local status signal.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 4b is a planar layout of the variable thickness gate oxide anti-fuse transistor of FIG. 4a;

FIG. 5b is a planar layout of the two-transistor anti-fuse memory cell of FIG. 5a;

FIG. 6b is a schematic of a programmed anti-fuse transistor of FIG. 4a;

FIG. 21a is a plan view of the test memory array of FIG. 18 using the mask programmed skewed ROM cells of FIG. 20a;

FIG. 21c is an illustration of the data states stored in the skewed ROM cells of FIG. 21a;

DETAILED DESCRIPTION

Generally, the present invention is directed to a dual function serial and parallel data register with integrated program verify functionality. The dual function serial and parallel operation gives the user the option for serial or parallel data interfacing in a single circuit, while integrating program verify functionality for reducing circuit logic overhead by utilizing the master and slave latching circuits of the data register to concurrently store two different words of data. In a program verify operation, the master latch stores program data and the slave latch will receive and store read data. Comparison logic in each register stage will compare the data of both latches and integrate the comparison result to that of the previous register stage. The final single bit result will indicate the presence of at least one bit that has not been programmed. If reprogramming is necessary, automatic program inhibit logic in each stage will prevent successfully programmed bits from being re-programmed in each subsequent reprogram cycle. Because two data words can be concurrently stored in the dual function data register embodiments of the present invention, either data word can be serially clocked out by selectively starting the shift operations on either the low or high active logic level of a clock signal. Significant circuit area is conserved relative to the prior art program verify schemes because a second data register is not required.

Figure 9:
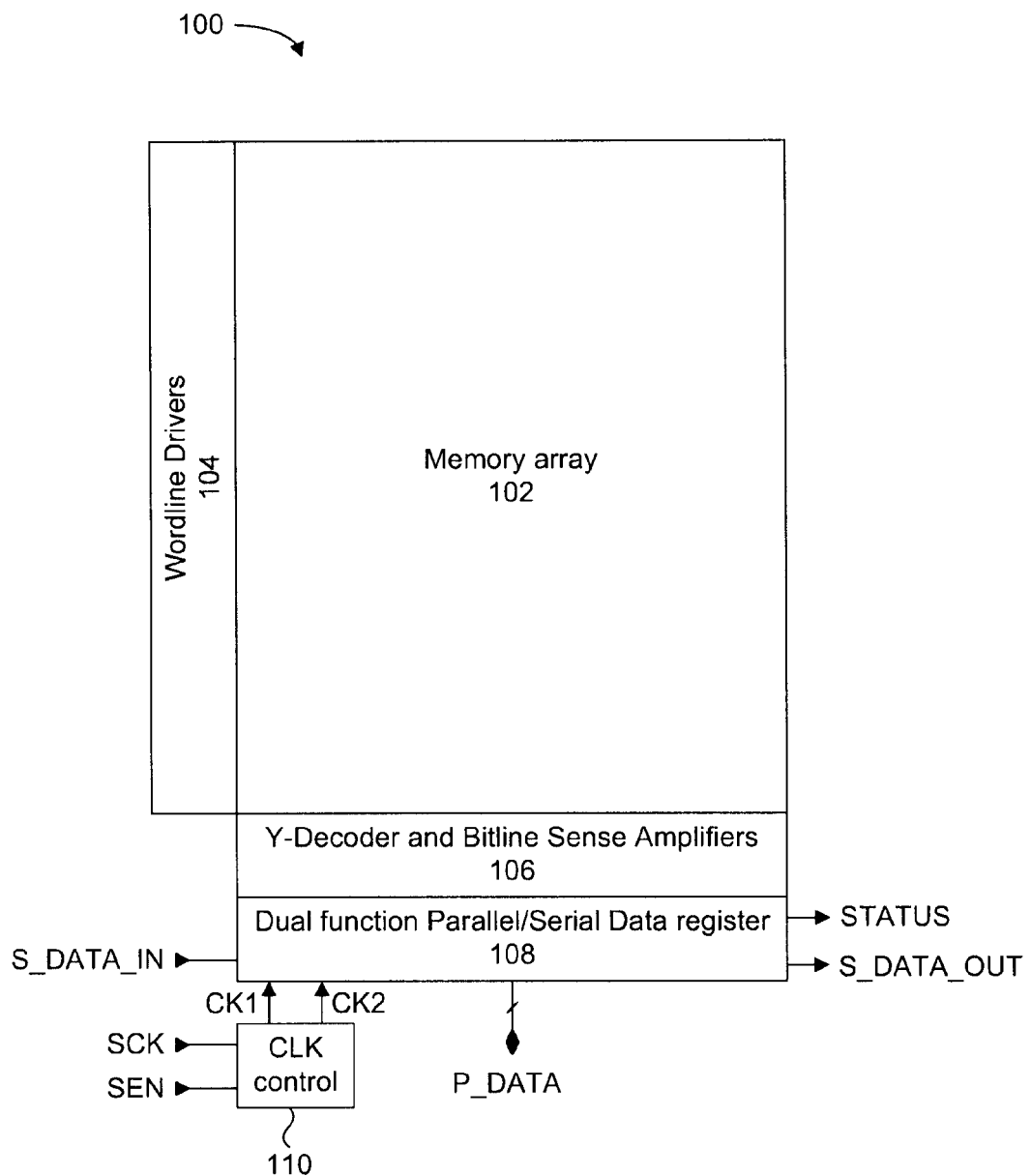
FIG. 9 is a block diagram of a non-volatile memory device having a dual function data register with integrated program verify circuitry, according to an embodiment of the present invention.

FIG. 9 is a block diagram of a non-volatile memory device having a dual function serial and parallel data register according to an embodiment of the present invention. The non-volatile memory device 100 includes a memory array 102 consisting of non-volatile memory cells connected to wordlines and bitlines, such as the anti-fuse memory cells shown in FIGS. 4a, 4b, 5a and 5b. It is noted that memory array 102 can be implemented with other non-volatile memory cells, such as EEPROM or Flash memory cells. Wordline drivers 104 drive the wordlines to read or programming voltages, while column decoder and sense amplifiers 106 are coupled to the bitlines for sensing and multiplexing the sensed data to the dual function serial and parallel data register 108. A clock controller 110 provides the clock signals to control the shifting function of the dual function serial and parallel data register 108.

Dual function serial and parallel data register 108, referred simply as the dual function data register 108 from this point forward, is configured to facilitate execution of many useful features. Dual function data register 108 can receive and provide data in both a parallel format and a serial format. This is to accommodate systems that memory device 100 is integrated in or used with, the flexibility for a parallel or serial interface with the same design. For a parallel data interface, parallel data P_DATA can be asynchronously coupled to and from dual function data register 108 via a bidirectional bus. Alternately, separate input and output busses can be used for carrying the parallel input data and the parallel output data, respectively. For a serial data interface, serial input data is received at input port S_DATA_IN and serial output data is provided at output port S_DATA_OUT. Shifting of serial data is controlled by phase adjustable clock signals CK1 and CK2, which are controlled by source clock SCK and a shift enable signal SEN. As will be discussed later, one of two data words stored in dual function data register 108 can be synchronously shifted out by controlling the time that SEN is driven to the active logic level relative to SCK. Logic for automatically inhibiting programmed cells from being further programmed, and cascaded logic for generating the program verify status signal STATUS, is integrated into dual function data register 108 for program verify operations.

Figure 10:
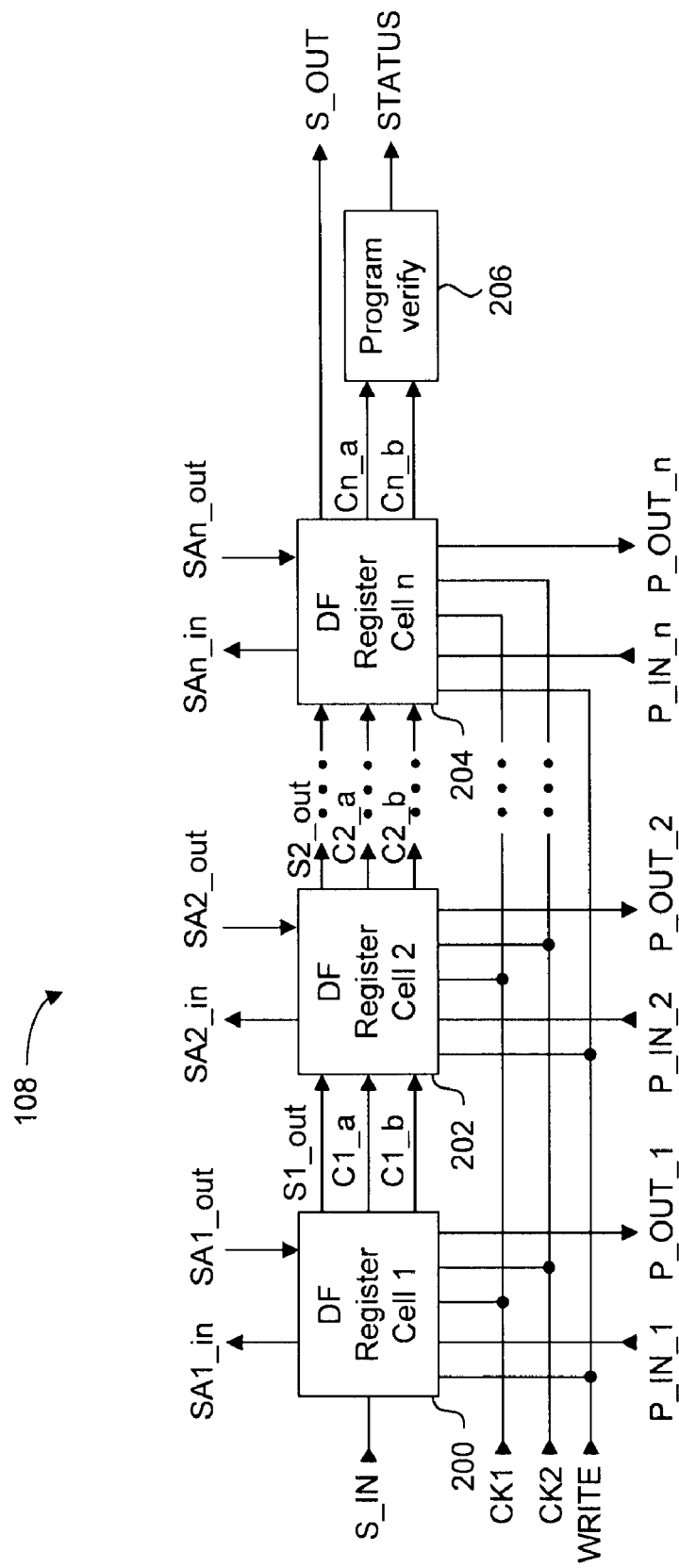
FIG. 10 is a block diagram showing details of the dual function data register of FIG. 9.

FIG. 10 is a block diagram showing further details of dual function data register 108, according to an embodiment of the present invention. The dual function data register can be used for temporary data storage for two different data words, to provide data to be programmed in the anti-fuse memory cell array, and to store data retrieved from the memory cell array. It is also used for comparing the data to be programmed with contents of the programmed cells for program verify purposes. The dual function data register 108 is an n-bit serial/parallel shift register, where n is an integer value greater than 0, and consists of individual register stages. FIG. 10 shows first register stage 200, second register stage 202 and the last (nth) register stage 204. Each register stage has a parallel input P_IN controlled by a WRITE signal, a parallel output P_OUT, and receives clock signals CK1 and CK2. The WRITE signal allows for asynchronous parallel write to the register, while CK1 and CK2 allow shifting of the register contents in and out synchronously with a source clock SCK (not shown). Each register stage has a serial input terminal for receiving data from a previous register stage, and a serial output terminal for providing data to a subsequent register stage. For example, register stage 202 has a serial input terminal for receiving serial output data S1_OUT from register stage 200, and has a serial output terminal for providing serial output data S2_OUT to the next register state. The first register stage 200 receives serial input data through input port S_IN, and provides serial output data through output port S_OUT.

With specific reference to register stage 202, each register stage will provide program data to a memory cell through terminal SA1_in during a program operation, while receiving read data from a memory cell through terminal SA_out during a read operation or a program verify operation. Those skilled in the art will understand that the program data can be provided either directly to the selected bitline or to the selected bitline through a sense amplifier, and that the read data is provided from a sense amplifier. Each register stage can provide two program verify signals, noted as C1_a and C1_b for register stage 200 for example. C1_a indicates if the initial programming operation was successful for all bits, while C1_b indicates if a re-programming operation is successful for all bits. The reason for having two different comparison results will be discussed in more detail later. The two comparison results from each register stage are fed to a subsequent register stage, which then combines the result with its own comparison results. The combined result is then fed to the next stage. A final stage of logic, the program verify logic 206, receives the last two comparison results from the last register stage 204, and generates a single STATUS signal. The STATUS signal will be used to indicate if an initial program operation was successful or if a subsequent re-program operation was successful. Program verify logic 206 can be implemented outside of dual function data register 108.

Figure 11:
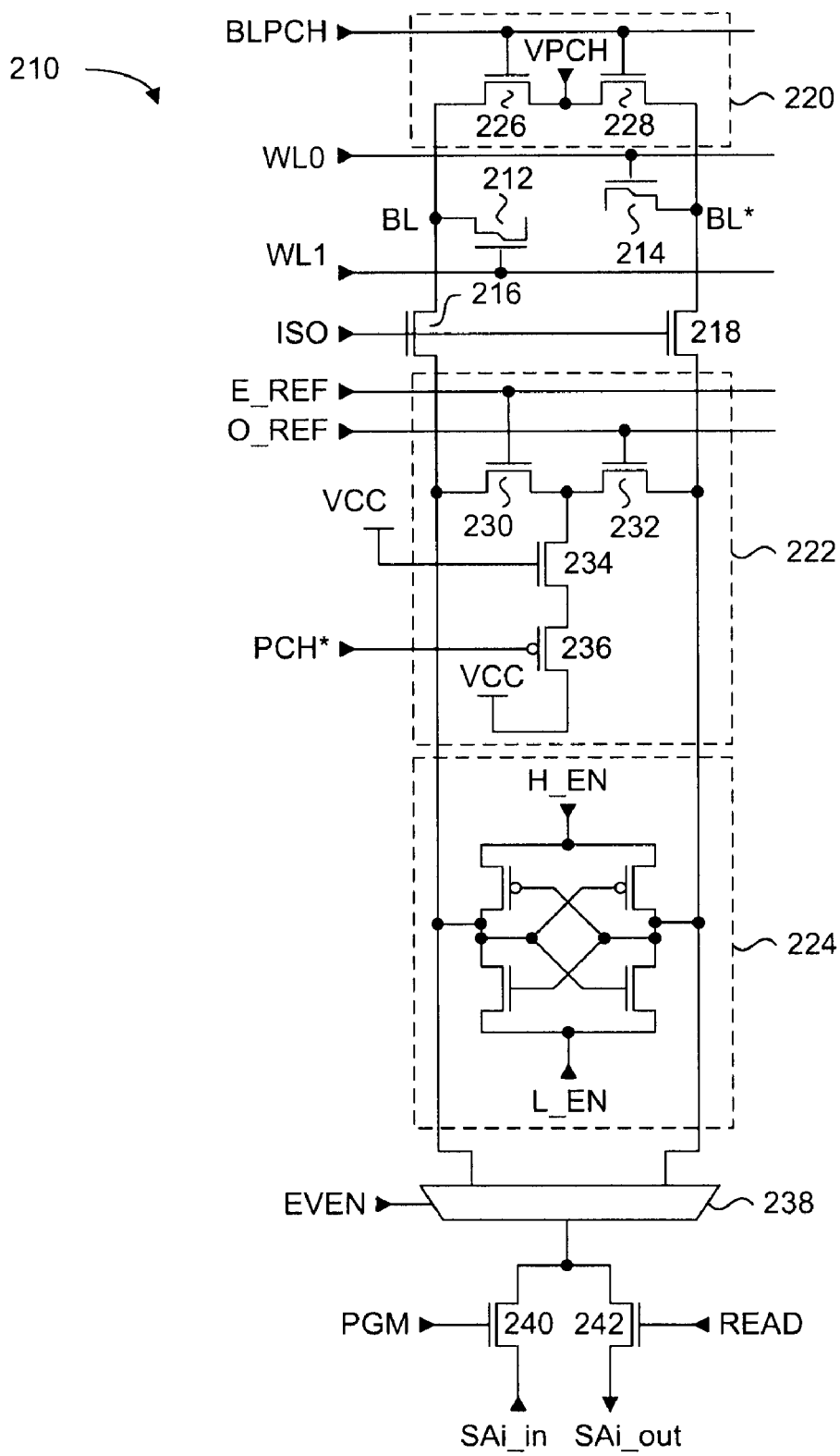
FIG. 11 is a circuit schematic of a folded bitline sensing scheme for an anti-fuse memory array.

FIG. 11 is a schematic of a portion of a folded bitline anti-fuse memory array 102 and its associated bitline sensing circuitry 106 of FIG. 9. In order to simplify the schematic, only one folded bitline pair BL/BL* and two wordlines are shown. Column decoder circuitry is not shown for selectively coupling multiple folded bitline pairs to the bitline sense amplifier circuitry. Folded bitline anti-fuse memory array 210 includes wordlines WL0 and WL1 connected to the gate terminals of n-channel anti-fuse transistors 212 and 214, n-channel isolation transistors 216 and 218 for coupling the upper portion of the bitlines to the lower portion of the bitlines in response to signal ISO, and bitline sensing circuitry. The bitline sensing circuitry includes a precharge circuit 220, a reference charge circuit 222, and a bitline sense amplifier 224.

The precharge circuit 220 includes two n-channel precharge transistors 226 and 228 connected in series between BL and BL* and having their gate terminals connected to precharge signal BLPCH. The shared source/drain terminal of precharge transistors 226 and 228 receives a precharge voltage VPCH. In operation, both precharge transistors 226 and 228 will turn on to precharge bitlines BL and BL* to VPCH in response to an active high logic level of BLPCH, in preparation for a read operation.

The reference charge circuit 222 includes n-channel steering transistors 230 and 232 connected in series between BL and BL*, a capacitance circuit implemented as an n-channel transistor 234, and a p-channel precharge transistor 236. Steering transistor 230 has its gate terminal connected to even selection signal E_REF, while steering transistor 232 has its gate terminal connected to odd selection signal O_REF. Capacitance circuit 234 has its gate terminal connected to voltage supply VCC, and is connected in series with precharge transistor 236 between the shared source/drain terminal of steering transistors 230 and 232 and voltage supply VCC. Precharge transistor 236 has its gate terminal connected to a precharge or enable signal PCH*. Generally, capacitance circuit 234 will be precharged when a low logic level PCH* pulse is received. The duration of the PCH* pulse can be predetermined based on the size of transistor 234 and the desired reference charge to be provided. Once precharged, either steering transistor 230 or 232 is turned on to couple the reference charge of capacitance circuit 234 to the corresponding bitline. By example, the charge being added to a bitline can be approximately 50 millivolts. It is noted that signals E_REF and O_REF can be controlled by the same even/odd addressing bit used for selecting WL0 or WL1. In one embodiment, activation of WL0 will cause E_REF to be activated, thereby coupling the reference charge to the complementary bitline.

The bitline sense amplifier 224 consists of a standard cross-coupled inverter circuit that is well known in the art. The circuit includes p-channel transistors both connected in series to respective n-channel transistors. The common drain terminal of the p-channel transistors receives a high logic level enable signal H_EN, while the common source terminal of the n-channel transistors receives a low logic level enable signal L_EN. H_EN can be a lowered internal VCC level, while L_EN can be a VSS level. The operation of bitline sense amplifier 224 in the DRAM art is well known. When enable signals H_EN and L_EN are activated, either at the same time or at different times, bitline sense amplifier 224 will sense a small voltage differential between BL and BL*, and quickly drive both BL and BL* to the full logic level states of H_EN and L_EN.

Because bitline sense amplifier 224 is connected to both bitlines BL and BL*, the logic state being programmed or read from the memory array will depend on the memory cell that is accessed. For example, if both anti-fuse transistors 212 and 214 store a logic 1, bitline sense amplifier 224 will latch two different logic states depending on which anti-fuse transistor is accessed. Therefore, a data state corrector 238 is used for ensuring that the voltage level corresponding to logic 1 and 0 states is read and programmed. In the present example, if WL0 is activated to read anti-fuse transistor 214, then signal EVEN will be at the logic state for coupling BL* to gating transistor 242. Alternately, of WL1 is activated to read anti-fuse transistor 212, then signal EVEN will be at the opposite logic state for coupling BL to gating transistor 242. The operation of data state corrector 238 is similar when program data is to be coupled to either BL or BL* from gating transistor 240. Data state corrector 238 can be implemented as a simple bidirectional multiplexor controlled by signal EVEN, which can be related to the address used to select wordline WL0 and WL1. Signal EVEN can be related to signals E_REF and O_REF as well. Data to be programmed to the bitlines is provided through n-channel gating transistor 240 which is coupled to SAi_in and controlled by program signal PGM. Data to be read from the bitlines is provided through n-channel gating transistor 242 which is coupled to SAi_out and controlled by read signal READ. Accordingly, gating transistor 240 is turned on during a program operation while gating transistor 242 is turned on during a read operation. Variable "i" is an integer value between 1 and max number n, which represents the specific register stage of the dual function data register 108. Terminals SAi_in and SAi_out are connected to one register stage of the dual function data register 108.

Figure 12:
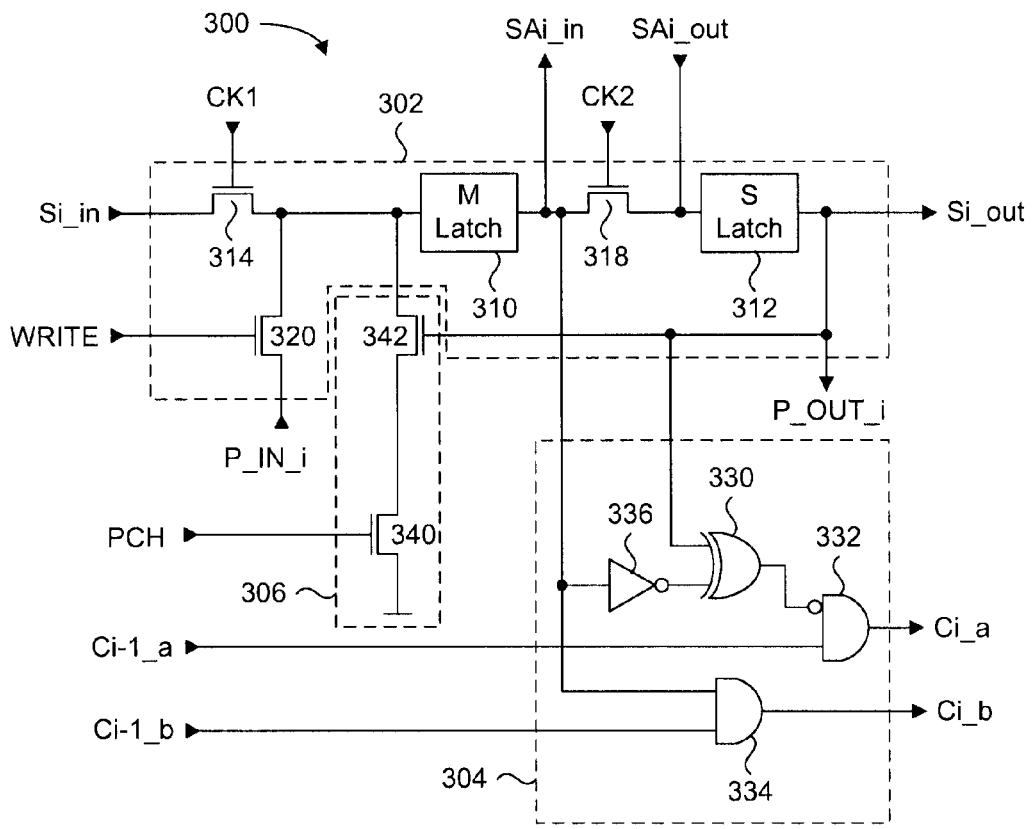
FIG. 12 is a circuit schematic of one register stage of the dual function data register shown in FIG. 10, according to an embodiment of the present invention.

FIG. 12 is a circuit schematic of one register stage of the dual function data register 108 shown in FIG. 10, according to an embodiment of the present invention. Data register stage 300 includes two main sections. The first section is the data storage circuit 302, which is responsible for data input, output and latching operations. The second section includes status circuit 304 and auto-program inhibit circuit 306. All the register stages of the dual function data register 108 shown in FIG. 10 will have the same circuit configuration shown in FIG. 12. The data storage circuit 302 will now be described. It is noted that variable "i" in the signal names denotes the register stage it is associated with, where "i" is any integer value greater than 0 and less than n, where n is the maximum number of register stages in the dual function data register 108.

Data storage circuit 302 includes a master latch 310 and a slave latch 312 connected as a master-slave flip-flop, serial input gating device 314, transfer gating device 318, and a parallel input gating device 320. Latches 310 and 312 can be implemented as simple cross-coupled inverter circuits with a non-inverting output relative to its input, but slave latch 312 will be configured to be overwritten by master latch 310 in a program operation. Those skilled in the art will understand that transistor sizing can be configured to achieve this desired effect. Gating devices 314 and 318 are shown as n-channel transistors, but can be transmission gates or p-channel devices. Gating device 314 has its gate terminal connected to clock signal CK1, while gating device 318 has its gate terminal connected to clock signal CK2. CK1 and CK2 are controlled clock signals. Gating devices 314 and 318 are controlled by CK1 and CK2 to shift data serially from the serial input terminal Si_in to the master latch 310, or from master latch 310 to slave latch 312, or from slave latch 312 to serial output terminal Si_out. Parallel input data P_IN_i is provided to the input of master latch 310 via gating device 320 when signal WRITE is at the active logic level, which in the present example is the high logic level. Parallel output data P_OUT_i is provided from the output of slave latch 312. The output of master latch 310, typically being program data, is coupled to a sense amplifier via terminal SAi_in, while read data from the sense amplifier is provided from terminal SAi_out and stored by slave latch 312.

As previously mentioned, the program verify scheme utilizes two related circuits; the status circuit 304 and the auto-program inhibit circuit 306. The status circuit 304 includes an XOR logic gate 330, AND logic gates 332 and 334, and an inverter 336. Inverter 336, XOR gate 330 and AND gate 332 form a data match circuit, while AND gate 334 forms a reprogram verify circuit. XOR gate 330 has a first input connected to the output of slave latch 312 and a second input coupled to an output of master latch 310 via inverter 336. The output of XOR gate 330 is connected to a first inverted input of AND gate 332, which has its second input connected to input Ci-1_a. The output of AND gate 332 is a local status signal Ci_a. Input Ci-1_a is the local status signal of the previous register stage, and more specifically, the output of an AND gate 332 of the previous register stage. Local status signal Ci_a is connected to the second input of an AND gate 332 of the next register stage. AND gate 334 has a first input connected to the output of master latch 310 and a second input connected to input Ci-1_b, which is another local status signal from the previous register stage. The output of AND gate 334 is second local status signal Ci_b. Input Ci-1_b is connected to the output of an AND gate 334 of the previous register stage, while Ci_b is connected to the second input of an AND gate 334 of the next register stage. AND gate 334 simply combines the logic state of master latch 310 with the logic state of the master latch 310 of the previous register stage.

XOR gate 330 compares the logic state of slave latch 312 to the inverted state of master latch 310. The comparison result of XOR gate 330 is then compared and combined with the comparison result from the previous register stage using AND gate 332. This portion of the circuit is used to verify if the initial programming operation was successful or not speed up memory testing and verification process. It compares all the bits in a row simultaneously and the result is combined into a single output signal STATUS in FIG. 14. In a compare operation, STATUS goes high upon COMP activation and remains HIGH if all data bits match (logic 1 propagates through all data register stages) or goes LOW if a mismatch is detected (when any of the outputs of the XOR gates exit logic 1 instead of 0, indicating mismatch between the inverted data from master latch and data from slave latch). STATUS remains active for as long as COMP is held HIGH and is reset to its default LOW state when COMP is LOW. Before the COMP operation, master latches of the data register should be reloaded with the original desired data, and the slave latches should contain the actual data read from the memory cells after programming.

The auto-program inhibit circuit 306 is used to verify if a reprogramming operation was successful or not, when the auto-program inhibit circuit 306 is engaged after an initial program operation failure. The auto-program inhibit circuit 306 includes a precharge device 340 and a coupling device 342 connected in series between a voltage supply such as VDD and the input of master latch 310. Both devices 340 and 342 are shown as being n-channel transistors in the present embodiment. The gate of precharge device 340 is connected to precharge signal PCH and the gate of coupling device 342 is connected to the output of slave latch 312. The selection of the voltage supply depends on the logic state stored by master latch 310 for selecting a memory cell to be programmed. For example, if master latch 310 stores a logic 0 (VSS) to indicate programming of the memory cell connected to that bitline, then the voltage supply connected to precharge device 340 will be VDD. Hence, VDD is the logic state stored in a master latch 310 for a memory cell that is not to be programmed. The auto-program inhibit circuit will therefore change the state of the master latch 310 if the memory cell was successfully programmed. In the present example, a successfully programmed memory cell will result in slave latch 312 storing a high a logic state in a program verify read operation following a program operation. Therefore, when PCH is driven to the high logic level, VDD is coupled to the input of master latch 310 to flip its state.

Figure 13:
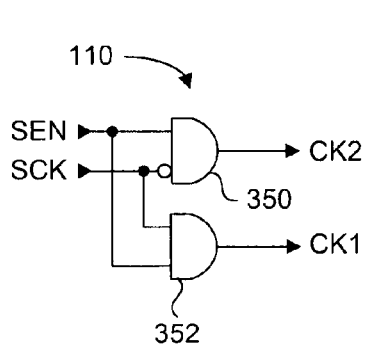
FIG. 13 is a circuit schematic of the clock controller shown in FIG. 9, according to an embodiment of the present invention.

The data shifting operation and the logic comparison operation of the data register stage 300 will be discussed later in further detail. Prior to such a discussion, a description of the clock controller 110 of FIG. 9 follows. FIG. 13 is a circuit schematic of the clock controller 110, according to an embodiment of the present invention. Clock controller 110 includes a first AND logic gate 350 and a second AND logic gate 352. Both AND gates 350 and 352 have a first input for receiving shift enable signal SEN, while AND gate 352 has a second input for receiving source clock signal SCK and AND gate 350 has a second input for receiving the complement of SCK. The output of AND gate 350 is clock signal CK2 and the output of AND gate 352 is clock signal CK1. Therefore while SEN is at the inactive low logic state, the output of AND 350 and CK1 will be at the inactive low logic state. A notable feature is the ability to control the starting phase of CK1 and CK2 by selecting when to drive SEN to the active high logic level when SCK is either at the high or low logic level. Hence CK1 and CK2 are phase adjustable clock signals.

Figure 14:
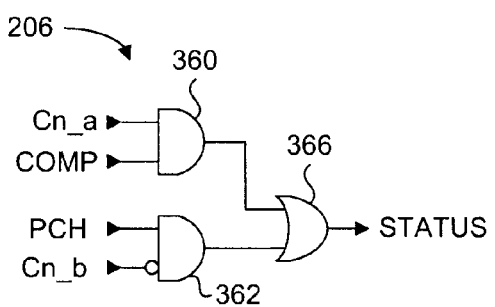
FIG. 14 is a circuit schematic of the program verify logic shown in FIG. 10, according to an embodiment of the present invention.

Following the discussion of the program verify logic 206 will be an overview of the operation of the entire dual function data register. FIG. 14 is a circuit schematic of the program verify logic 206, according to an embodiment of the present invention. Program verify logic 206 includes AND logic gates 360, 362 and OR logic gate 366. AND gate 360 receives Cn_a, which is the first program verify signal from the last register stage, and a compare enable signal COMP. The output of AND gate 360 is connected to a first input of OR gate 366. AND gate 362 receives Cn_b at its inverted terminal, which is the second program verify signal from the last register stage, and the precharge signal PCH at its non-inverted terminal. The output of AND gate 362 is connected to a second input of OR gate 366.

Generally, the operation of the program verify logic 206 is described. In the high speed program verify operation for example, after program operation signal STATUS goes high (logic 1 for example) upon COMP activation to the high logic state, and remains high if all data bits match (for example, the logic 1 propagates through all data register stages) or goes low (logic 0 for example) if a mismatch is detected. A mismatch is detected when any of the outputs of the XOR gates exit logic 1 instead of 0, indicating a mismatch between the inverted data from master latch 310 and data from slave latch 312. The STATUS signal remains active for as long as COMP is held high and is reset to its default low state when COMP is low. Before the COMP operation, master latches of the data register should be loaded with the original desired data, and the slave latches should contain the actual data read from the memory cells after programming. During this high speed program verify operation, PCH is held inactive at the low logic level.

Figure 15:
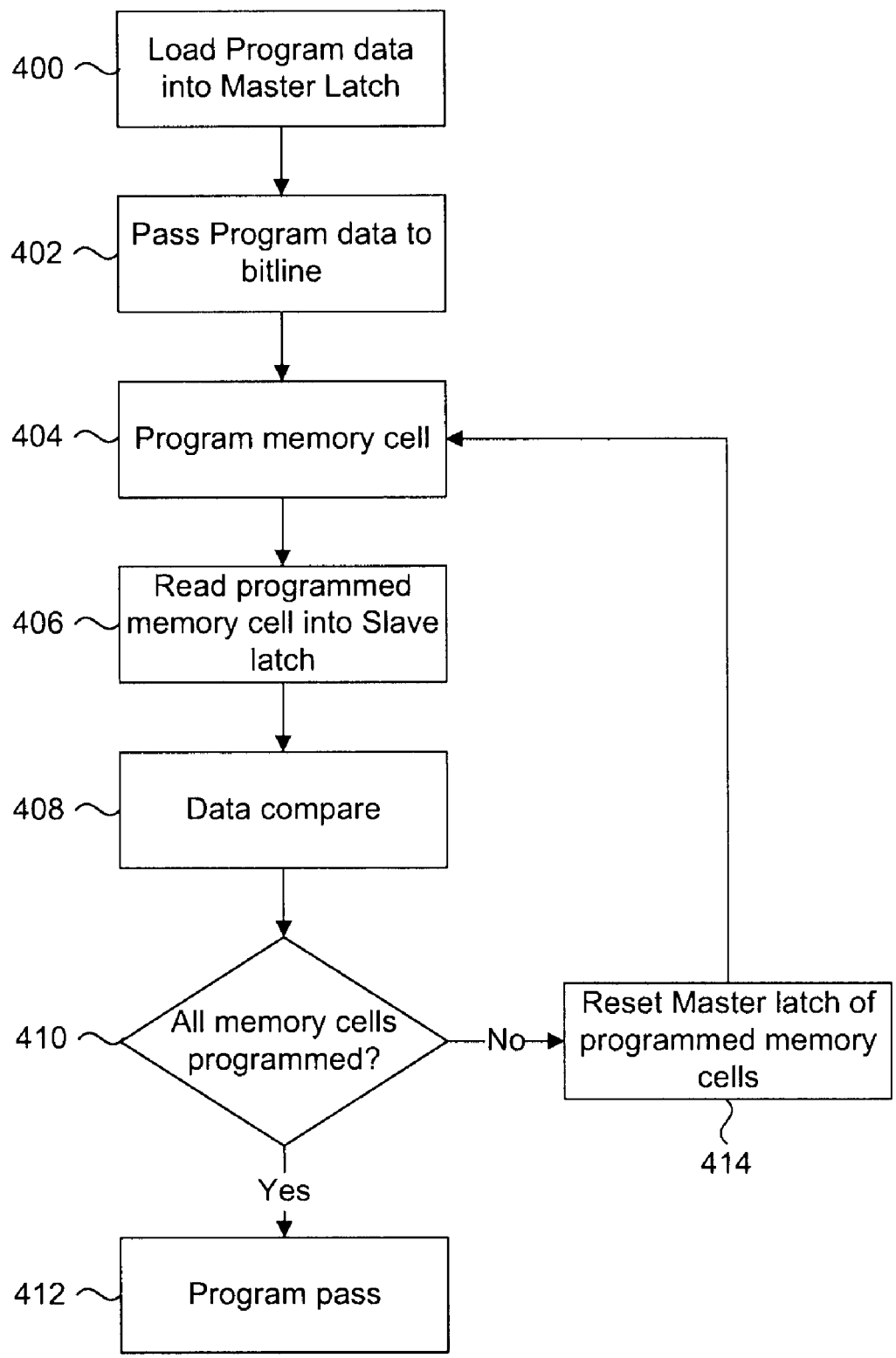
FIG. 15 is a flow chart of a method for executing a program verify operation using the dual function data register, according to an embodiment of the present invention.

The program verify and data shifting operations of the dual function page register 108 will now be described, as reference will be made to the circuits shown in FIGS. 10, 12, 13 and 14. Following is a description of the operation of dual function page register 108 for program and program verify operations, with reference to the flow chart of FIG. 15.

Starting at step 400, the program operation begins with loading of the dual function page register 108 with data to be programmed. Program data to be stored in the anti-fuse memory cells are either loaded in parallel through the P_IN_i ports or serially by shifting in the bits from the S_IN port of the first register stage 200 of FIG. 10. In the parallel loading operation, signal WRITE is raised to the active high logic level to load the master latch 310 with the data bit. In the serial loading operation, the bits are to be shifted into the master latch 310 of each register stage. Referring to FIG. 13, this is done by driving SEN to the active high logic level while SCK is at the high logic level. Therefore, the shifting operation starts with CK1 at the high logic level and CK2 at the inactive low logic level. Therefore with SEN held at the high logic level, SCK continues to oscillate to alternately drive CK1 and CK2 to the active high logic level until all the bits of the program data are shifted into the master latches 310 of all the register stages. In the present example where the memory cells are the anti-fuse transistors shown in FIGS. 4a, 4b, 5a and 5b, any master latch 310 storing a logic 0 (VSS) will cause an anti-fuse transistor connected to the corresponding bitline to be programmed. Any master latch 310 storing a logic 1 (VDD) will inhibit an anti-fuse transistor connected to the corresponding bitline from being programmed.

Following at step 402, column decoders are activated based on a particular column address, and the bitlines are driving to voltage levels corresponding to the logic states stored in the master latches 310. With the bitlines biased based on the program data stored in the dual function data register 108, a selected wordline is driven to the VPP programming voltage at step 404 to begin programming. Only the anti-fuse memory cells connected to the selected wordline and a bitline biased to VSS should be programmed, meaning that a conductive link between its polysilicon gate and its channel region should be formed. Now the program verify operation commences at step 406 by reading out the states of the anti-fuse memory cells that were just subjected to the programming operation. This is done by executing a normal read operation by driving the same wordline with a read voltage. The data is sensed and loaded into the slave latches 312 of each register stage. It is noted that SEN is set to the inactive low logic level to keep all the gating devices 314 and 318 turned off. Now the master latches 310 are storing the program data for the selected memory cells and the slave latches 312 store the read data from the same selected memory cells.

Using XOR gate 330, the stored data in master latch 310 and slave latch 312 of each register stage are compared to each other. If the master latch 310 stored a logic 0 for programming the memory cell, then a read operation on a successfully programmed memory cell will yield a logic 1 stored in the slave latch 312. Therefore, because of inverter 336, XOR gate 330 will provide a low logic level output in such a case. In the opposite case where the master latch 310 stored a logic 1 for inhibiting programming of the memory cell, a read operation on a non-programmed memory cell will yield a logic 0 stored in the slave latch 312. Therefore, XOR gate 330 will again provide a low logic level output. Both these cases indicate that programming was successful. On the other hand, if the memory cell was not properly programmed, or insufficiently programmed, then the read operation will yield a logic 0 stored in the slave latch 312. XOR gate 330 will then provide a high logic level output, thereby indicating unsuccessful programming of the memory cell. It should be noted that the first register stage will have its Ci-1_a and Ci-1_b terminals tied to logic 1 (ie. VDD). These program verify results from each stage are fed serially to the next register stage until the last Ci-1_a program verify output is provided to AND gate 360 of program verify logic 206.

In program verify logic 206, PCH is held at the low logic level and COMP is driven to the high logic level for the initial program operation to assess the result of all the comparisons in each register stage. This corresponds to a data compare step 408 in FIG. 15. If Cn_a is at the high logic level when COMP is at the high logic level, status signal STATUS will be at the high logic level. This means that all the register stages have reported successful programming of their respective memory cells. Alternately, if at least one register stage reports failed programming, then Cn_a will be at the low logic level, and STATUS will be driven to the low logic level to signal failed programming to the system. At step 410, if STATUS is at the high logic level to indicate successful programming of all the bits, then the program verify operation ends at step 412. If STATUS is at the low logic level to indicate failed programming, then the method proceeds to step 414 to commence reprogramming after the initial program operation. At step 414, the master latches 310 corresponding to successfully programmed cells are reset to a logic level that inhibits further programming for that particular memory cell. In FIG. 12 for example, this is done by driving PCH to the high logic level, which will couple VDD (logic 1) to master latch 310 if the slave latch 312 stores a logic 1. Hence each register stage automatically inhibits further programming of its corresponding memory cell if it was successfully programmed. Unsuccessfully programmed memory cells will have their corresponding slave latch 312 store a logic 0, thereby allowing its master latch 310 to retain the logic 0 data.

The method then loops back to step 404 to repeat programming of only the unsuccessfully programmed memory cells, as selected by the register stages. The data is once again read out from the memory cells at step 406. Now at step 408, a different data compare operation is executed by the register stages in order to confirm successful programming of all the bits.

At step 410 the output of all master latches 310 are compared to each other via AND gates 334, and the final output Cn_b is received by program verify circuit 206 of FIG. 14. The precharge signal PCH enables the auto-program inhibit circuit 306 of all the register stages to remove all the bits that are already programmed from the master latch by flipping their states to an opposite logic level, ie. a logic 1, and activates the STATUS signal indicating if any of the bits require further programming. The STATUS signal remains active as long as PCH is kept at the high logic level. PCH at the high logic level enables AND gate 362 of the program verify circuit 206 to pass the Cn_b signal. Cn_b at the high logic level, when all the master latches 310 store a logic 1 for example, indicates successful programming of all the bits. A high logic level Cn_b is inverted at the input of AND gate 362 to drive STATUS to the low logic level, indicating successful programming of all the memory cells. On the other hand, if even one master latch still retains a logic 0 state, then Cn_b will be at the low logic level, and STATUS will be at the high logic level to indicate the presence of at least one unsuccessfully programmed bit of data. If STATUS is high, then the method loops back to step 404 for a further reprogram iteration. It is noted that step 414 has essentially been executed in step 408, and is therefore redundant for reprogramming iterations. The number of reprogram iterations can be monitored, and the entire process can be halted if it appears that certain memory cells are not programmable.

The dual function register 108 of the present embodiment can be used for applications other than for program verify operations, as previously shown. The dual function register 108 can be used to temporarily store two different words of data for other applications. For example, in the parallel mode of operation where program data has been loaded into the register stages in parallel in preparation for a programming operation, the programming operation can be suspended while a read operation is executed. Hence data read from the memory array can be stored in the slave latches and read out in parallel while program data is stored in the master latches of the register stages. Once the read operation has been completed, the program operation can resume. Once again in the parallel mode of operation, a first data word can be loaded into the master latches 310 through parallel input ports P_IN_i, and then shifted to the slave latches 312 by pulsing SEN to the high logic level while SCK is at the low logic level. Then a second data word can be loaded into the master latches 310. The first data word can be immediately read out through the P_OUT_i port, then the second data word is shifted to the slave latches 312 and read out through the P_OUT_i port. If only the second data word is desired, then the first data word is overwritten as the bits of the second data word are shifted into the slave latches 312. In the previously described operations, there is only data shifting within each register stage.

Figure 16:
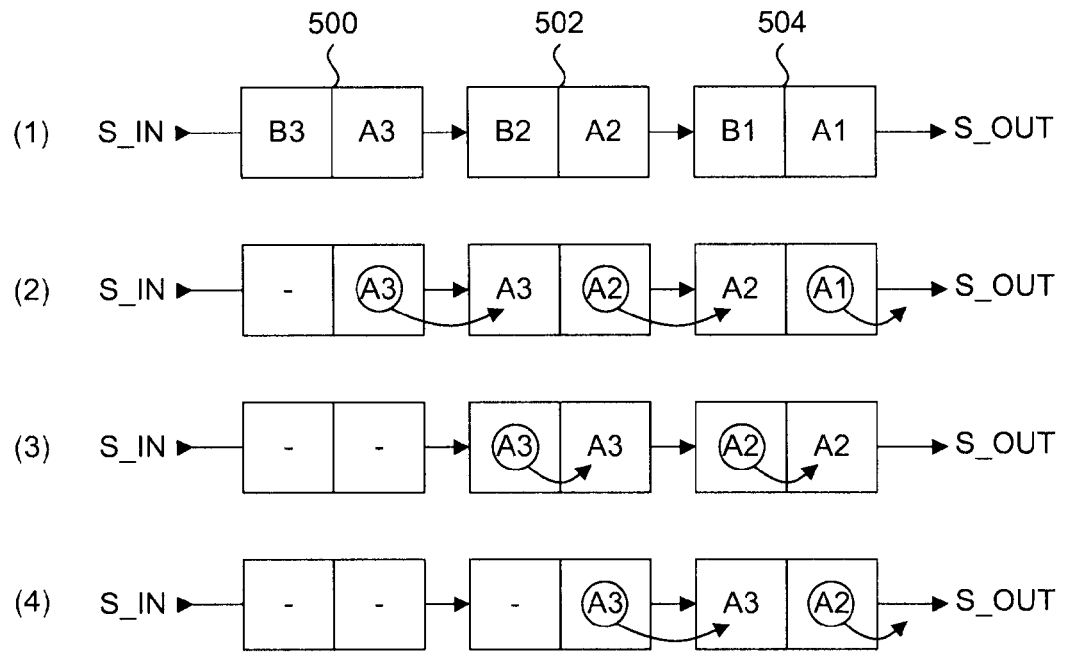
FIG. 16 is an illustration of an example serial shift operation of the dual function data register of FIG. 12 with a corresponding sequence diagram of the clock signals.
Figure 16:
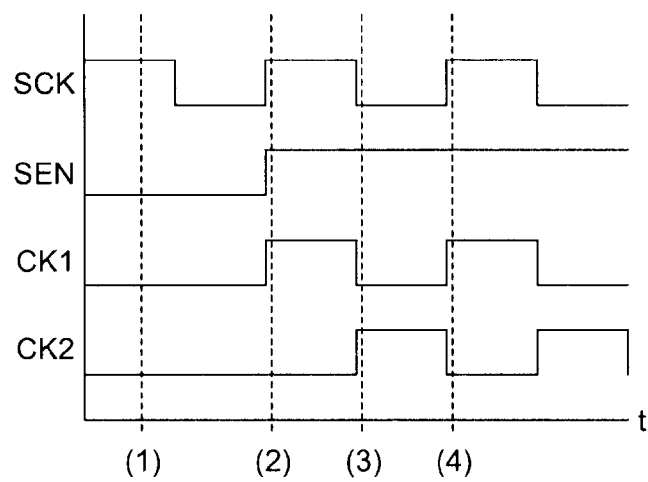

Serial output of one of the two data words stored in the dual function data register 108 is possible, according to an embodiment of the present invention. For example, one data word provided by the memory system can be serially shifted into the master latches 310 or provided in parallel into the master latches 310, while a second data word can be read from the memory array and stored in the slave latches 312. FIG. 16 illustrates an example serial shift operation of dual function data register 108, where the data stored in the slave latches 312 of each register stage are read out through the serial output port S_OUT. In FIG. 16, the example dual function register includes three register stages, 500, 502 and 504, where each register stage includes a master latch represented by the box on the left, and a slave latch represented by the box on the right. It is assumed that each register stage has the circuit configuration shown in FIG. 12. A sequence diagram shows the signal traces for signals SCK, SEN, CK1 and CK2.

In the initial step (1), there are two data words stored in dual function register. Data bits A1, A2 and A3 correspond to a first data word stored in the master latches 310 while data bits B1, B2 and B3 correspond to a second data word stored in the slave latches 312. In step (1) there is no data shifting, hence signal SEN remains at the inactive low logic level. Therefore CK1 and CK2 are at the inactive low logic level. Serial output of the first data word from the slave latches 312 is initiated by driving shift enable signal SEN to the high logic level while SCK is at the high logic level. As shown in the sequence diagram of FIG. 16, CK1 will follow SCK while CK2 will be the complement of CK1 after SEN rises to the high logic level. Gating device 314 will open, thereby allowing the data from slave latches 312 to propagate to the next register stage. In FIG. 16, this is shown in step (2) where A1 is shifted to S_OUT, A2 is shifted to the master latch 310 of register stage 504 and A3 is shifted to the master latch 310 of register stage 502. In step (3) CK1 and CK2 change logic states, thereby executing an internal shift of data from the master latch 310 to the slave latch 312.

As source clock SCK oscillates, the data bits of the first data word will be shifted from register stage to register stage, until all the data bits of are output through output port S_OUT. Accordingly, the data stored in the master latches 310 is overwritten due to the shifting operations. The "-" designates invalid data which propagates from the S_IN input port during the shifting operations.

Figure 17:
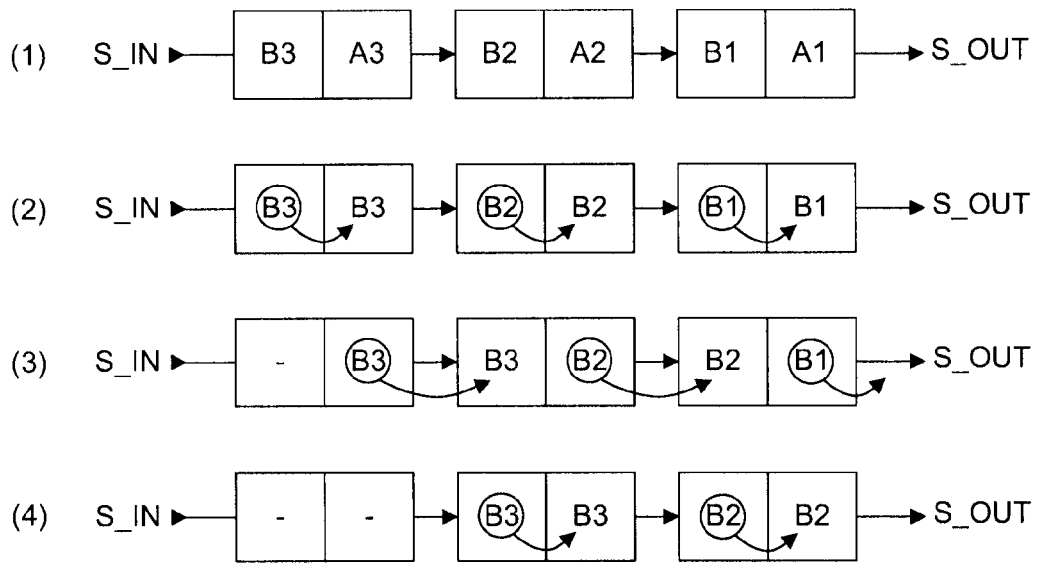
FIG. 17 is an illustration of another example serial shift operation of the dual function data register of FIG. 12 with a corresponding sequence diagram of the clock signals.
Figure 17:
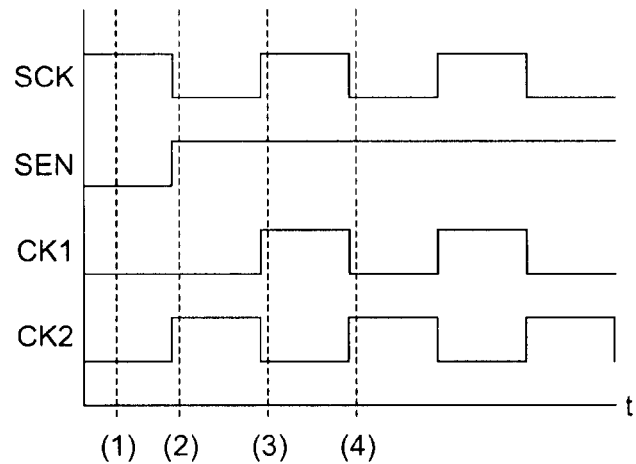

The above-described shifting sequence in FIG. 17 illustrates an example of a serial shift operation of dual function data register 108, where the data stored in the master latches 310 of each register stage are read out through the serial output port S_OUT. In FIG. 17, the example dual function register includes the same three register stages shown in FIG. 16. A sequence diagram shows the signal traces for signals SCK, SEN, CK1 and CK2.

In the initial step (1), there are two data words stored in dual function register. Data bits Al, A2 and A3 correspond to a first data word stored in the master latches 310 while data bits B1, B2 and B3 correspond to a second data word stored in the slave latches 312. In step (1) there is no data shifting, because signal SEN remains at the inactive low logic level. Therefore, CK1 and CK2 are at the inactive low logic level. Serial output of the second data word from the master latches 310 is initiated by driving shift enable signal SEN to the high logic level while SCK is at the low logic level. As shown in the sequence diagram of FIG. 17, CK2 will follow SCK while CK1 will be the complement of CK2 after SEN rises to the high logic level. Gating device 318 will open, thereby allowing the data from master latches 310 to propagate to the slave latch 312 of the register stage. In FIG. 17, this is shown in step (2) where B1, B2 and B3 are all shifted to their respective slave latches 312. In other words, the first operation is an internal shift of data from the master latch 310 to the slave latch 312. In step (3) CK1 and CK2 change logic states, and B1 is output to output port S_OUT. At the same time, B2 is shifted to the next register stage, and B3 is shifted to the next register stage. In step (4), and internal data shift is executed, which is the same as in step (2).

Therefore, by selecting when SEN is to be active relative to the source clock SCK for the first shift operation, the initial starting phase of CK1 and CK2 can be adjusted by 180 degrees. Therefore, either data word can be serially output by the dual function data register 108.

Figures 18, 19:
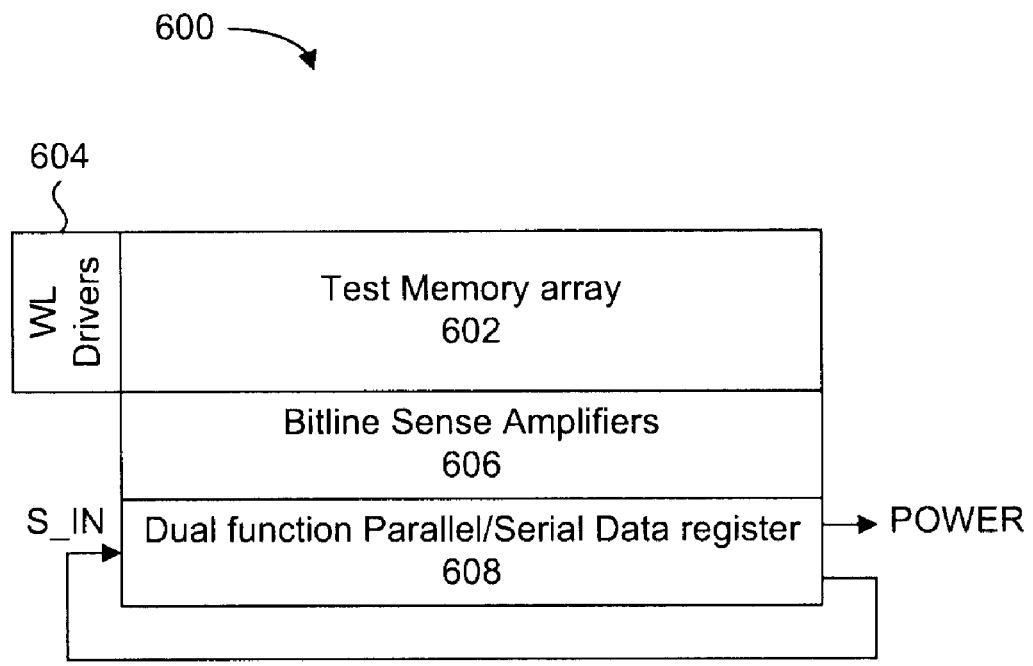
FIG. 18 is a block diagram of a power up detection system, according to an embodiment of the present invention.
FIG. 19 is an illustration of the data states stored in memory cells of the test memory array of FIG. 18.

The capability of the dual function data register 108 to store two data words can be advantageously used in other applications, such as a power up detection application. The purpose of a power up detection operation is to ensure that the power supplies have stabilized sufficiently after the device is powered up, so that read and program operations can be reliably executed. FIG. 18 is a block diagram illustrating a power up detection circuit according to an embodiment of the present invention. The power up test system 600 includes a test memory array 602, wordline drivers 604, bitline sense amplifiers 606, and a dual function data register 608. The test memory array 602 includes two rows of skewed read only memory (ROM) cells, where each memory cell has a threshold voltage that is higher than the programmed anti-fuse memory cells. There can be any number of memory cells per row. Further details of these skewed ROM cells will be shown later. The wordline drivers 604 apply a read voltage for reading the memory cells of a row, where the read voltage can be VREAD used for reading normal memory cells in the memory array 102 of FIG. 9 for example. The bitline sense amplifiers 606 are directly connected to the bitlines of the memory array, as no column decoding is required, for sensing voltage levels of the bitlines during the read operations. The same bitline sensing circuitry shown in FIG. 11 can be used in FIG. 18. The dual function data register 608 includes register stages coupled to each sense amplifier, and each register stage will have the same data storage circuit shown in FIG. 12. In the present embodiment, the output of the last register stage is connected to the input of the first register stage.

The general principle of the power up detection application is as follows. The test memory array will have two rows of ROM memory cells, where the first row and the second row are hard-wired to store different predetermined data patterns. More specifically, the second row will store the same predetermined data pattern as the first row, but shifted by one bit to the right. FIG. 19 illustrates by example a first row Row 1 having a five bit data pattern of "0,1,1,0,1" stored in five different ROM cells, and a second row Row 2 having the shifted data pattern of "1,0,1,1,0". It is noted that the last bit "1" of Row 1 now appears in the first bit position of Row 2. The first row is read out into the dual function data register 608 and then shifted by one bit position to the right. Because of the loop connection between the last register stage and the first register stage, the right-most bit is shifted to the left-most bit in the first stage of the second row. Then the second row is read out, thereby resulting in dual function data register 608 storing both data words concurrently. The shifted version of the data in Row 1 is compared to the data of Row 2. If they are the same, then the power supplies are deemed to be ready for normal use.

Therefore, if the power supply is not stable, then reading of the high threshold skewed ROM memory cells will likely yield improper data being read out from the first row or both the first and the second rows. Because the second row of data is shifted by one bit relative to the first row, the shifting functionality of the dual function data register will shift the stored first row of data to realign its bit positions with the second row of data. Once realigned, data comparisons of each bit position can be executed to determine if the data words were properly read out.

Figure 1:
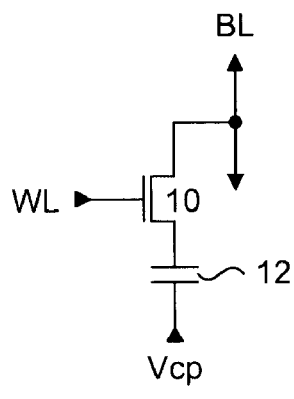
FIG. 1 is a circuit diagram of an anti-fuse memory cell.
Figure 2:
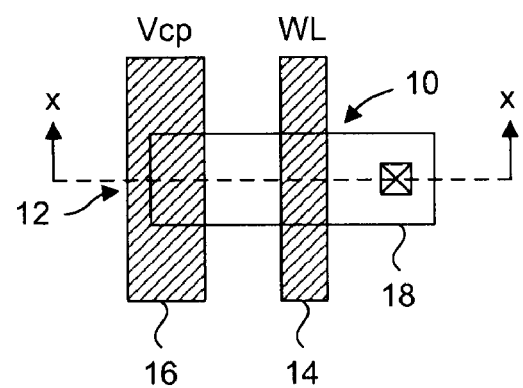
FIG. 2 is a planar layout of the anti-fuse memory cell of FIG. 1.
Figure 3:
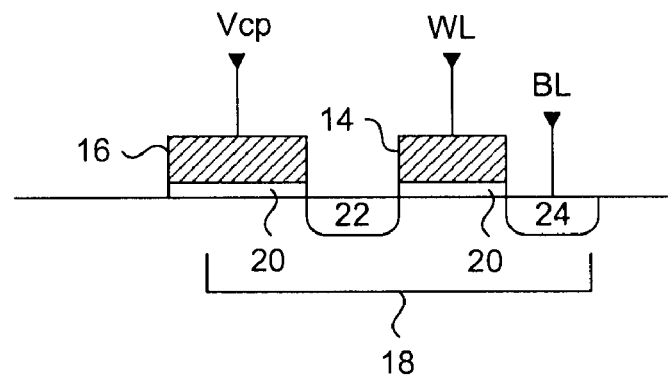
FIG. 3 is a cross-sectional view of the anti-fuse memory cell of FIG. 2 along line x-x.
Figure 4A:
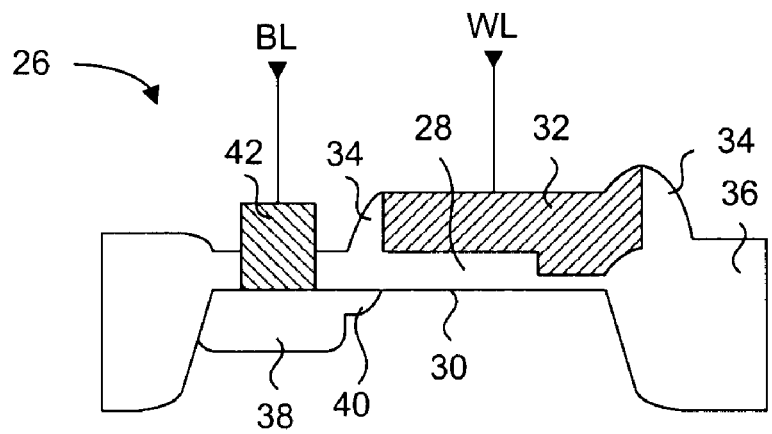
FIG. 4a is a cross-sectional view of a variable thickness gate oxide anti-fuse transistor.
Figure 4B:
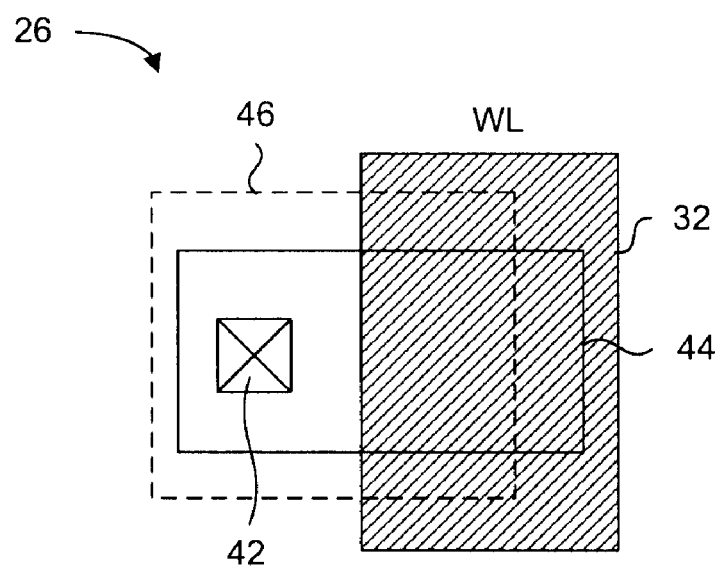
Figure 5A:
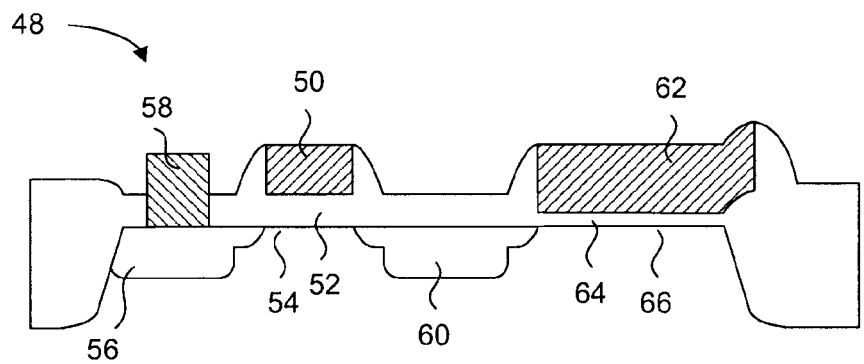
FIG. 5a is a cross-sectional view of a two-transistor anti-fuse memory cell.
Figure 5B:
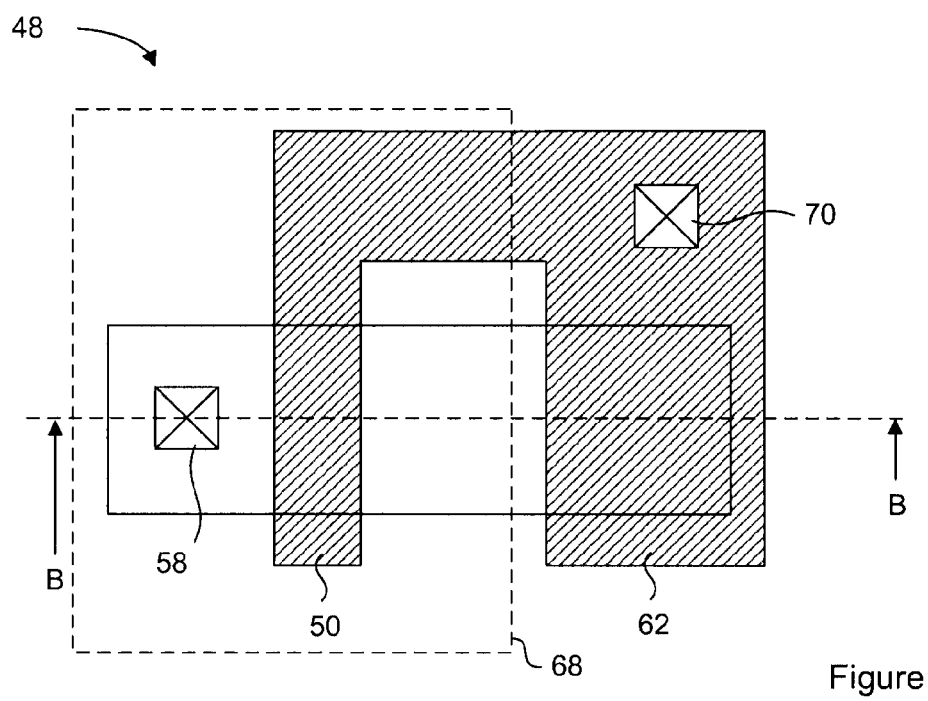
Figure 6A:
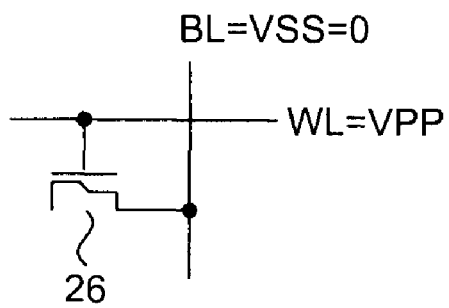
FIG. 6a is a schematic of the anti-fuse transistor of FIG. 4a under programming conditions.
Figure 6B:
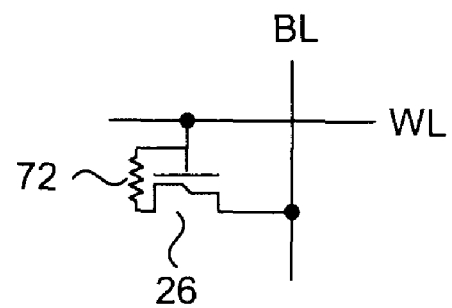
Figure 7:
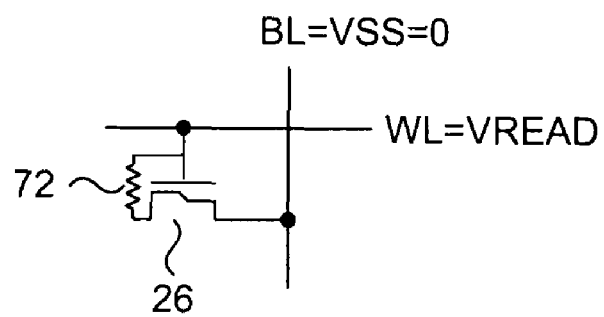
FIG. 7 is a schematic of a programmed anti-fuse transistor of FIG. 4a under read conditions.
Figure 8:
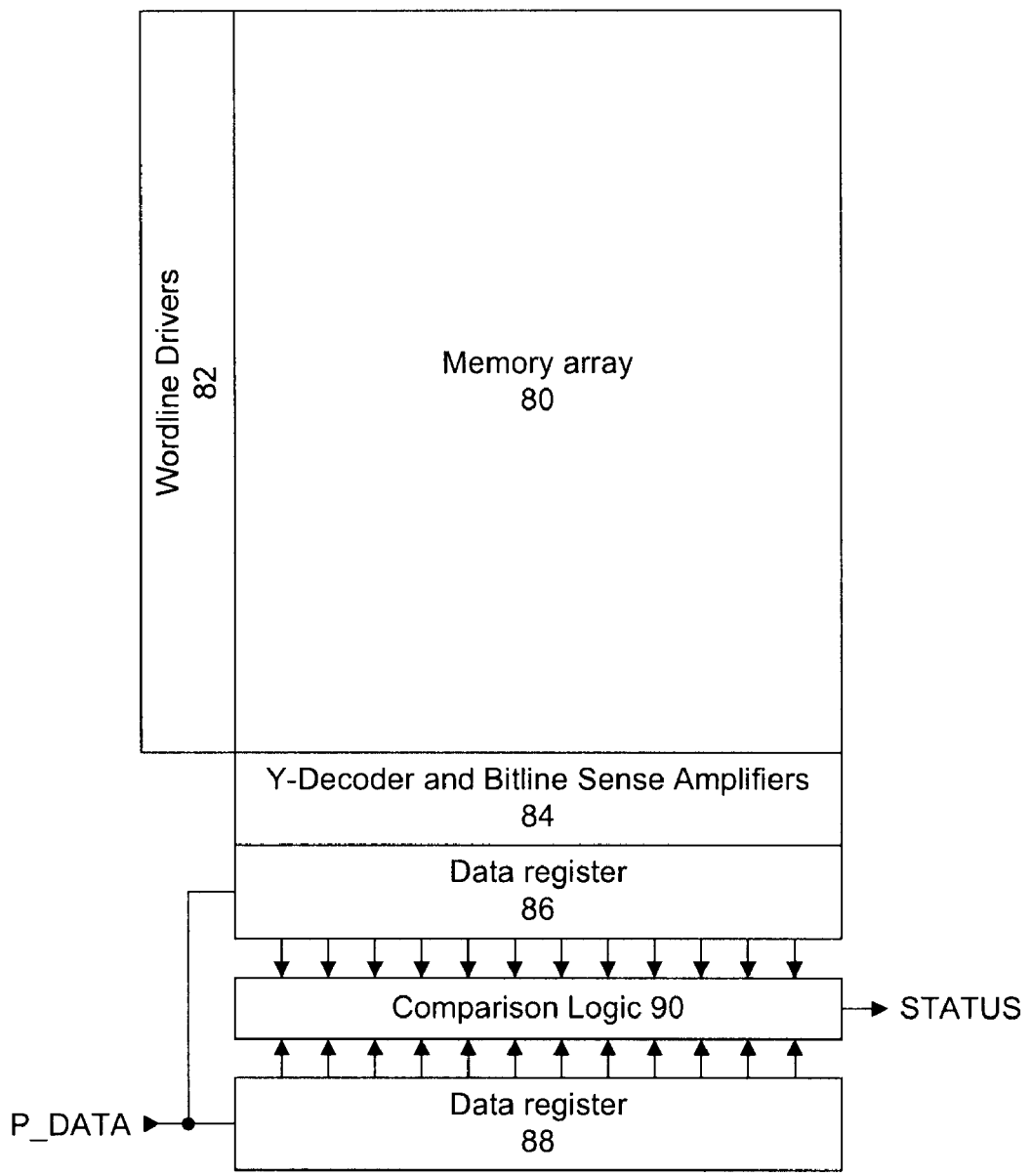
FIG. 8 is a block diagram of a prior art non-volatile memory device having program verify circuitry.
Figure 20A:
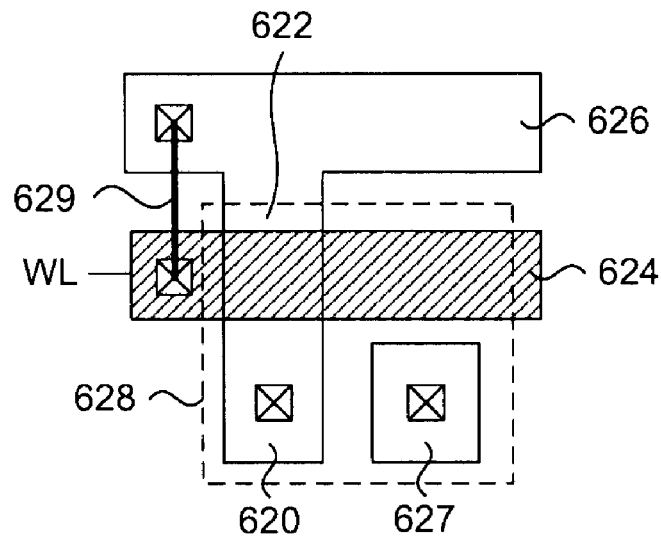
FIG. 20a is a plan view of mask programmed skewed ROM cells, according to an embodiment of the present invention.
Figure 20B:
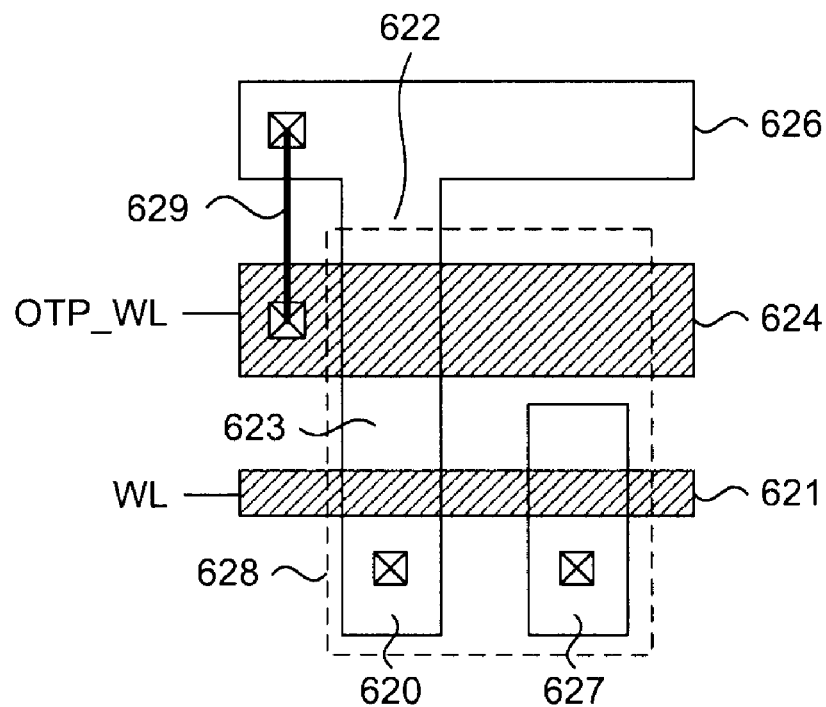
FIG. 20b is a plan view of mask programmed two transistor skewed ROM cells, according to an embodiment of the present invention.

The skewed ROM memory cells are designed to be properly read out when the power supply voltage is stable and at the proper voltage level. FIGS. 20*a* and 20*b* show examples of mask programmed and unprogrammed skewed ROM cells, respectively. FIG. 20*a* is a plan view of a pair of mask programmed single transistor skewed ROM cells. The skewed ROM cell on the left has a first diffusion region 620, an additional diffusion region 622, and a polysilicon line 624 overlying a channel region. The additional diffusion region 620 is connected to a diffusion line 626, resulting in a memory cell that is mask programmed to store a first logic state. The skewed ROM cell on the right consists only of a diffusion region 627, but more specifically, is a memory cell that does not have a channel region formed under the polysilicon line 624 during fabrication. Accordingly, this memory cell is mask programmed to store a second logic state being opposite to the first logic state. In the present embodiment, an OD2 mask 628 defines areas in which thick gate oxide is to be formed. Since OD2 mask 628 extends over the entire channel region underneath polysilicon line 624, the gate oxide will have a uniform thickness. The polysilicon line 624 will include a conductive connection 629 to the additional diffusion region 622 via diffusion line 626, thereby configuring the skewed memory cell to be similar to the programmed anti-fuse transistor having a conductive link shown in FIG. 6*b*. The first diffusion region 620 is coupled to a bitline, and is raised to VREAD when the polysilicon line is driven with VREAD.

This skewed ROM cell is designed in such a way that it requires a more stable power supply voltage to turn on than the most weakly programmed anti-fuse memory cell. More specifically, when WL is driven to VREAD, its bitline BL will be pulled up towards VDD if the power supply driving WL is sufficiently high. Accordingly, the voltage on BL will be at least the elevated threshold voltage. To achieve this desired electrical characteristic, the skewed ROM cell can be a high voltage, long channel transistor with an elevated threshold voltage via channel implantation. Those skilled in the art will understand that the skewed ROM cell can be configured differently in order to achieve the desired electrical characteristics.

Because the unprogrammed skewed ROM cell in the right of FIG. 20*a* does not have a channel region under polysilicon line 624, the bitline will remain at a VSS precharged voltage level when WL is driven to the read voltage level.

FIG. 20*b* is a plan view of a pair of mask programmed two transistor skewed ROM cells. The two transistor skewed ROM cell on the left side of FIG. 20*b* includes the same first diffusion region 620, additional diffusion region 622, and polysilicon line 624, now referred to as an OTP_WL, overlying a channel region. These features are present in the single transistor skewed ROM cell of FIG. 20*a*. Because memory cell includes two transistor devices, there is a second polysilicon line 621 referred to as the wordline, and a shared diffusion region 623 between the polysilicon line 621 and the polysilicon line 624. In the present example, the left side two transistor skewed ROM cell is mask programmed to store a first logic level as it has the additional diffusion region 622 coupled to the diffusion line 626. The diffusion line 626 is coupled via conductive connection 629 to polysilicon line 624. Therefore, when OTP_WL is biased to a positive voltage level and the WL is selected, diffusion region 620 will be coupled to OTP_WL, thereby raising its corresponding bitline to the positive voltage level from low precharge level. On the other hand, because the unprogrammed skewed ROM cell in the right of FIG. 20*b* omits a channel region under polysilicon line 624, the bitline it is connected to will remain at a VSS precharged voltage level when WL is driven to the read voltage level. It is noted that OD2 mask 628 extends over the entire channel region underneath polysilicon line 624, hence the gate oxide underneath it will have the same thickness the gate oxide underneath polysilicon line 621.

Figure 21A:
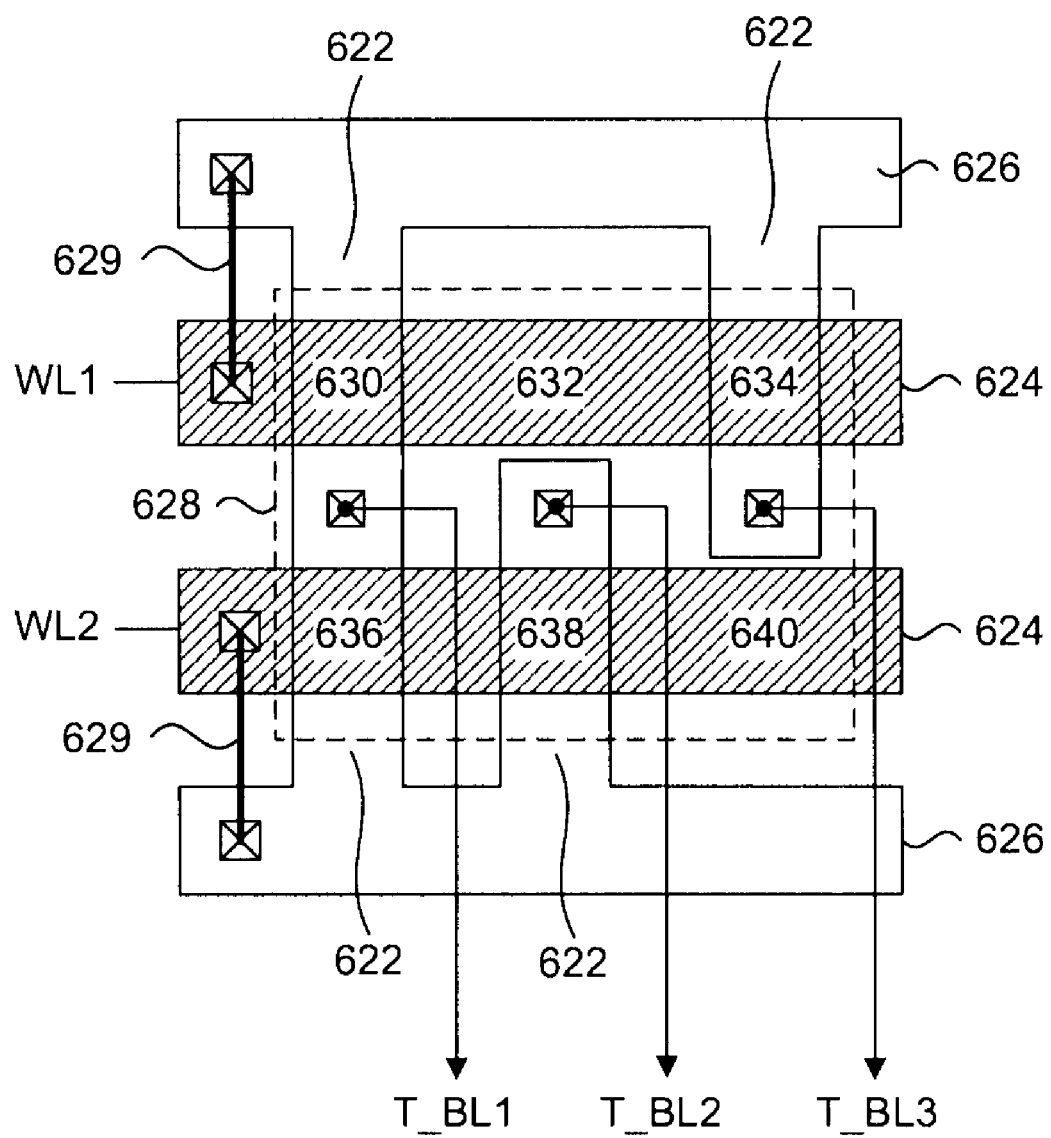

FIG. 21*a* is a schematic showing an array of skewed ROM cells which can be used in test memory array 602 of FIG. 18, according to a present embodiment. This array includes two rows, and each row includes three single transistor skewed ROM cells having the configuration shown in FIG. 20*a*. Therefore, the same reference numbers are used to identify the features first shown in FIG. 20*a*. The first row includes skewed ROM cells 630, 632 and 634 having their gates connected to wordline WL1, where cells 630 and 634 are mask programmed to store the logic 1 state. The second row includes skewed ROM cells 636, 638 and 640 having their gates connected to wordline WL2, where cells 636 and 638 are mask programmed to store the logic 1 state. Therefore, the data pattern of the row corresponding to WL1 is 1,0,1 while the data pattern of the row corresponding to WL2 is 1,1,0. The data pattern of the row corresponding to WL2 is shifted by one bit to the right relative to the row corresponding to WL1, where the rightmost bit has been shifted to the leftmost bit position. Three test bitlines, T_BL1, T_BL2 and T_BL3 are connected to the common bitline contacts shared by memory cell pairs 630/636, 632/638, and 634/640.

Figure 21B:
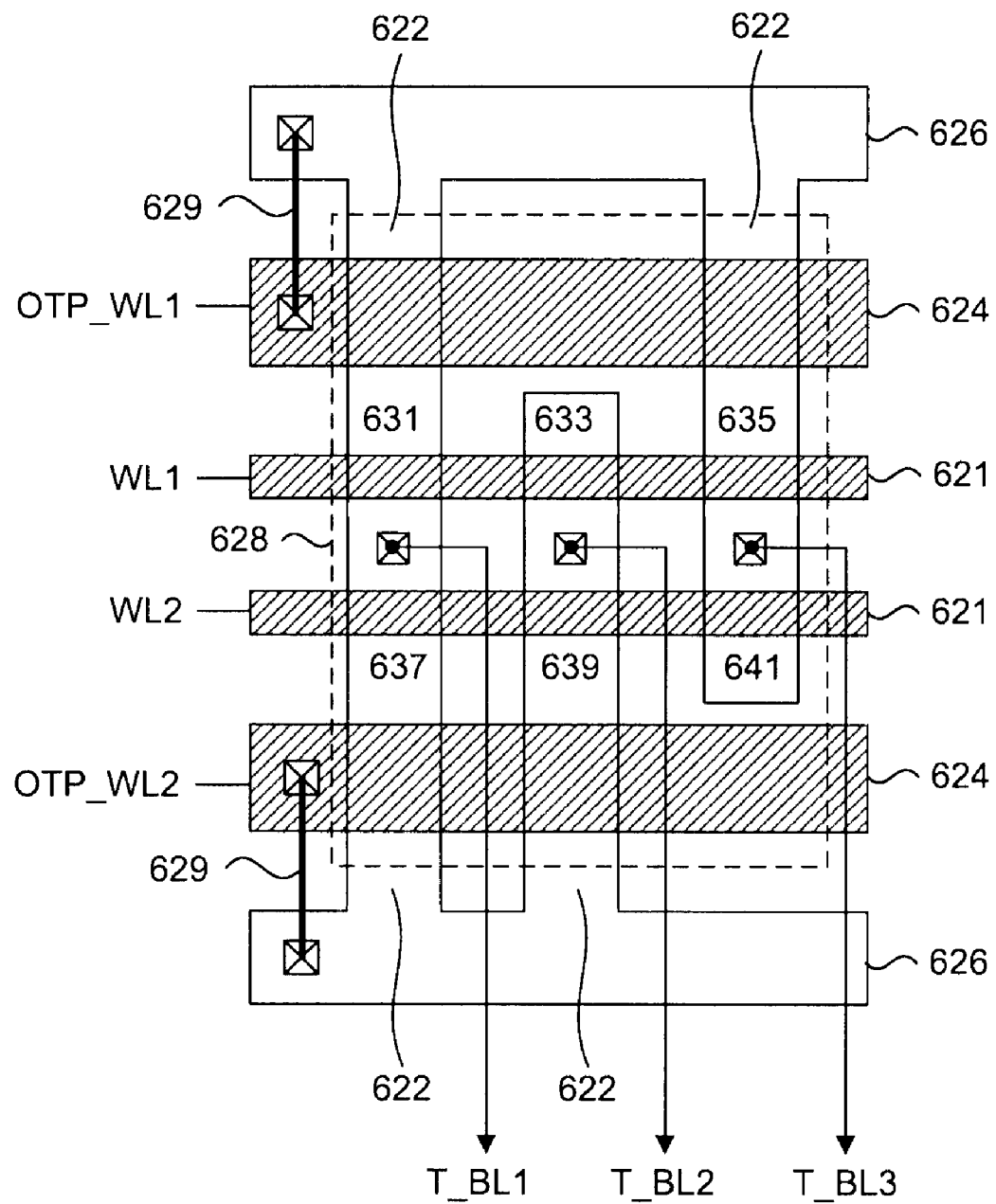
FIG. 21b is a plan view of the test memory array of FIG. 18 using the mask programmed two transistor skewed ROM cells of FIG. 20b.

FIG. 21*b* is a schematic showing an array of skewed ROM cells which can be used in test memory array 602 of FIG. 18, according to another embodiment. This array includes two rows, and each row includes three two transistor skewed ROM cells having the configuration shown in FIG. 20*b*. Therefore, the same reference numbers are used to identify the features shown in FIG. 20*b*. The first row includes skewed ROM cells 631, 633 and 635 having their gates connected to wordline WL1, where cells 631 and 635 are mask programmed to store the logic 1 state. The second row includes skewed ROM cells 637, 639 and 641 having their gates connected to wordline WL2, where cells 637 and 639 are mask programmed to store the logic 1 state. Therefore, the data pattern of the row corresponding to WL1 is 1,0,1 while the data pattern of the row corresponding to WL2 is 1,1,0. The data pattern of the row corresponding to WL2 is shifted by one bit to the right relative to the row corresponding to WL1, where the rightmost bit has been shifted to the leftmost bit position. Three test bitlines, T_BL1, T_BL2 and T_BL3 are connected to the common bitline contacts shared by memory cell pairs 631/637, 633/639, and 635/641.

Figure 21C:
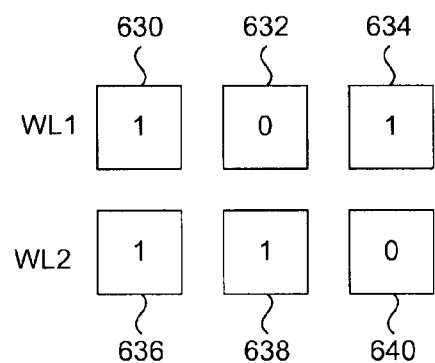

FIG. 21c is an illustration showing the logic states mask programmed into the skewed ROM cells corresponding to the memory cell positions shown in FIGS. 21a and 21b.

Figure 22:
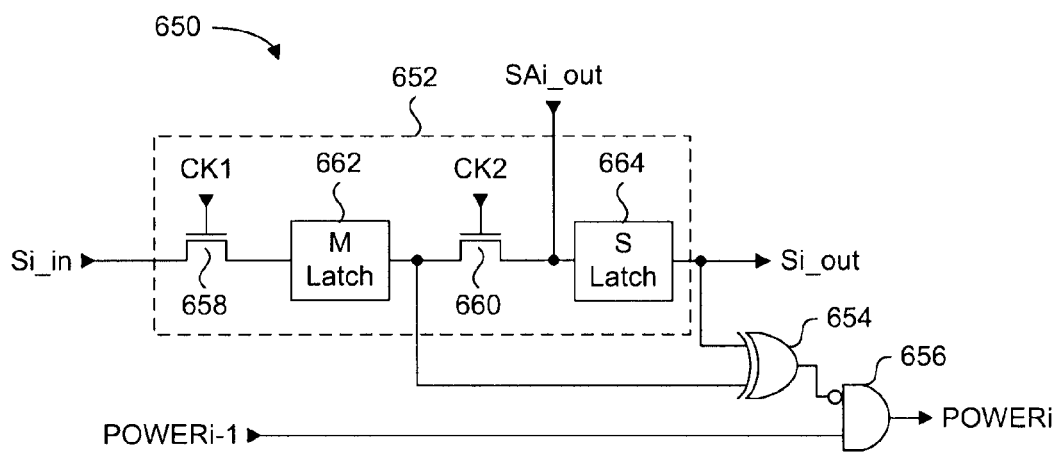
FIG. 22 is a circuit schematic of a register stage of the dual function data register of FIG. 18, according to an embodiment of the present invention.

FIG. 22 is a circuit schematic of one register stage of the dual function data register, according to the present embodiment. The register stage 650 includes a data storage circuit 652 and a data comparison circuit consisting of XOR gate 654 and AND gate 656. The data storage circuit 652 includes substantially the same components as data storage circuit 302 of FIG. 12, but does not include parallel input or output terminals for receiving or providing data in parallel. Data storage circuit 652 includes serial input gating device 658, transfer gating device 660, a master latch 662 and a slave latch 664. The gate terminal of gating device 658 receives clock signal CK1 and the gate terminal of gating device 660 receives clock signal CK2. Clock signals CK1 and CK2 can be generated by the same clock controller shown in FIG. 13. Accordingly, the data shifting operation of data storage circuit 652 will be the same as the data shifting operation previously described for data storage circuit 302 of FIG. 12. The input of slave latch 664 receives read data from the sense amplifier provided from terminal SAi_out.

The data comparison circuit performs two functions. First, it compares the data stored in the master latch 662 with the data stored in the slave latch 664, and provides an output corresponding to the comparison. This first function is executed by XOR gate 654, hence a low logic level output is provided when both the master latch 662 and the slave latch 664 store the same logic states. The second function is to combine the XOR gate output with a similar output from a previous register stage. This second function is executed by AND gate 656 which has a first input connected to the output or XOR gate 654 and a second input connected to POWERi-1, where i is any non-zero integer value between 1 and n, and n corresponds to the last register stage of the dual function data register 608. In particular, POWERi-1 is provided from an AND gate 656 of the previous register stage. It is noted that in the first register stage, POWERi-1 is replaced with a connection to VDD. The output of AND gate 656 is signal POWERi, which is provided to the next register stage, and in particular to a second input of an AND gate 656 of the next register stage. Therefore, if every register stage has the same logic level stored in their master and slave latches, then the last POWERi signal will be at the low logic level, indicating that every data bit of the first row of data and of the second row of data match. This means that the power supplies are stable enough for normal operation of the memory device.

Figure 23:
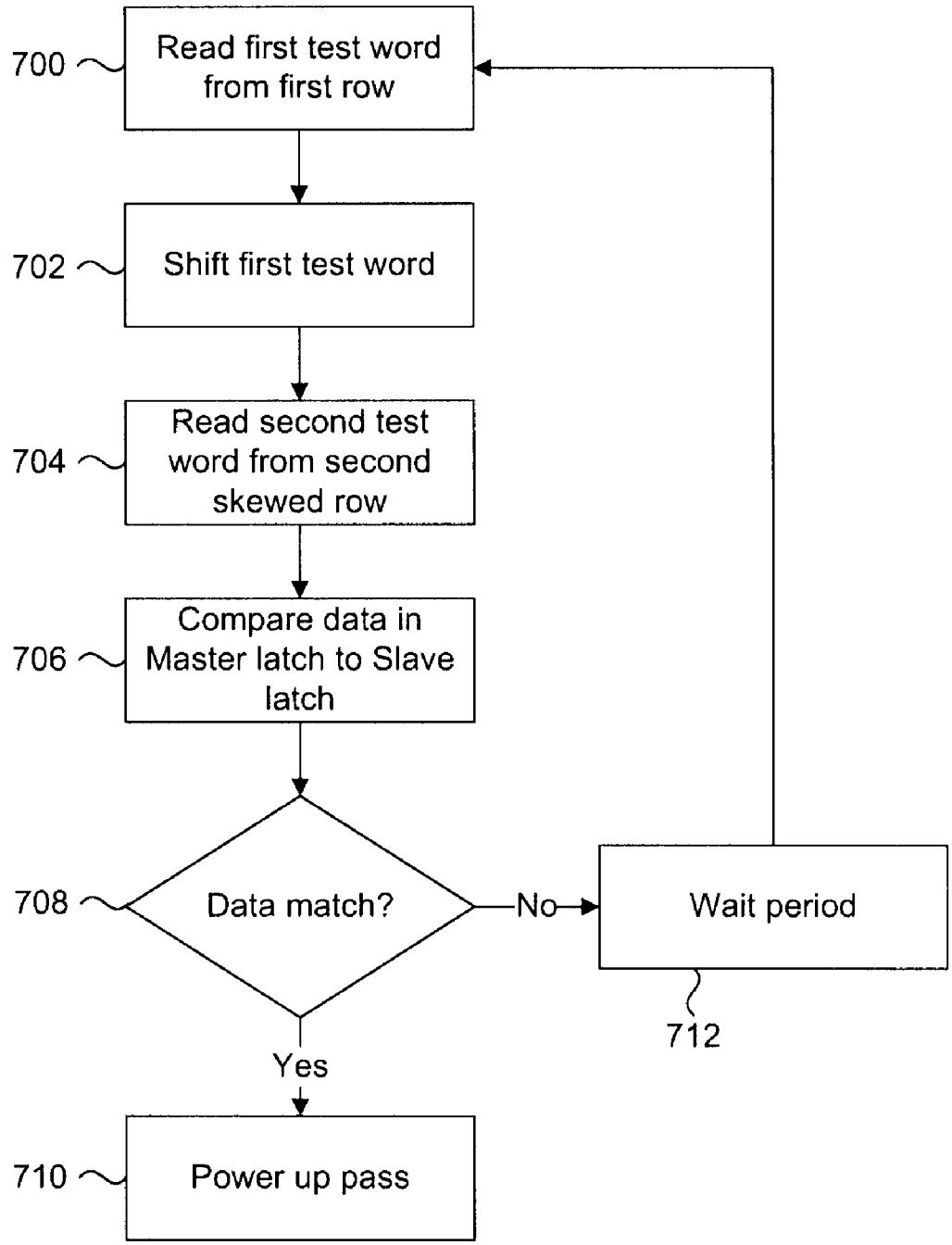
FIG. 23 is a flow chart of a power up detection method using the power up detection system of FIG. 18.
Figure 24:
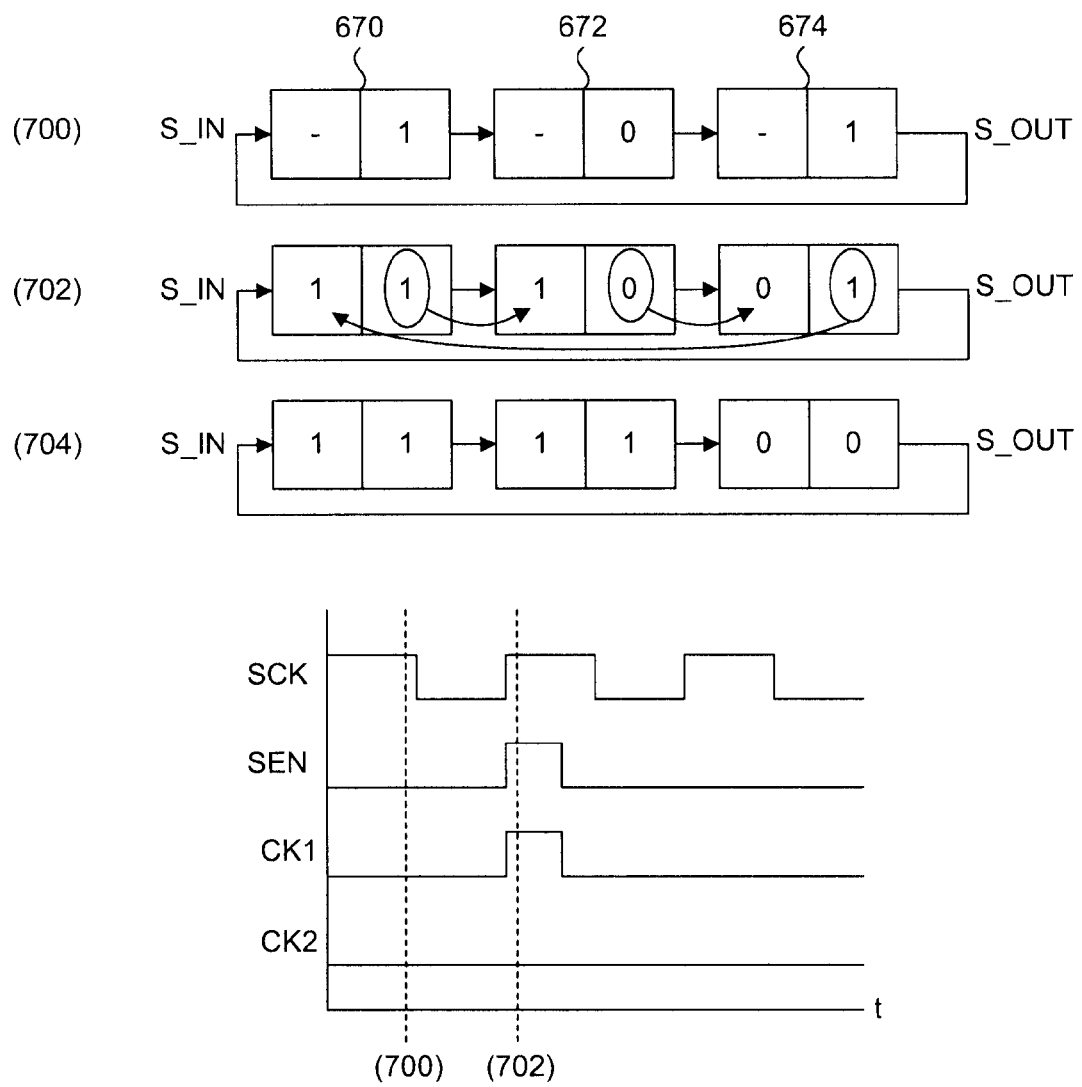
FIG. 24 is an illustration of a serial shift operation of the dual function data register of FIG. 18 with a corresponding sequence diagram of the clock signals; and, FIG. 25 is a circuit schematic of one register stage of the dual function data register, according to an alternate embodiment of the present invention.

FIG. 23 is a flow chart of a power up detection method, according to an embodiment of the present invention, using the power up test system 600 of FIG. 18. FIG. 24 illustrates the propagation of the data bits during the power up detection method, and a sequence diagram shows the signal traces for signals SCK, SEN, CK1 and CK2. The method will be described using the example test memory array shown in FIG. 18. In FIG. 24, the dual function data register includes three register stages 670, 672 and 674, where each register stage has the circuit configuration shown in FIG. 22. The method starts at step 700 by reading out the first test word by activating wordline WL1. The data is sensed and latched in the slave latches 664 of each register stage 650. It is noted that both CK1 and CK2 are maintained at the low logic level while data is latched by the slave latches 664, by maintaining SEN at the low logic level. As shown for step (700) of FIG. 24, the slave latches 664 (right boxes) of register stages 670, 672 and 674 will store logic 1,0,1 if the power supply is at the proper levels. If the power supply is not stable, then the data word stored in register stages 670, 672 and 674 will be different. It is noted that the master latches 662 of register stages 670, 672 and 674 stores invalid or don't care data.

At step 702, the first test word stored in register stages 670, 672 and 674 is shifted one bit position to the right. This is done by pulsing SEN to the active high logic level while SCK is at the high logic level. However, since only a single bit shift operation is required, SEN will be at the high logic level for a period of time no longer than the high logic level of SCK. Therefore, CK1 will be at the high logic level for the same time period that SEN is at the high logic level, to turn on the serial input gating devices 658 of each register stage. As shown for step (702) of FIG. 24, all the bits stored in the slave latches 664 are shifted to the master latches 662 of the next register stage, with the exception of the last bit of register stage 674 which is shifted, or fed back, to the master latch 662 of register stage 670. Following at step 704 the second test word is read out, sensed, and then latched in the slave latches 664 of register stages 670, 672 and 674. As shown for step (704) of FIG. 24, the data pattern 1,1,0 is now latched into the slave latches 664 of the register stages if the power supply is stable.

Now that both the first and second test words are stored in the dual function data register 608, the shifted version of the first test word is compared to the second test word determine if they are identical in step 706. In FIG. 22, the XOR gates 654 of each register stage will compare the logic states of the master latch 662 to the slave latch 664. The output of each XOR gate 654 is combined with a comparison result POWERi-1 of the previous stage, and the combined result POWERi is fed to the AND gate 656 of the next register stage. It is noted that the first register stage 670 will either not have an AND gate 656, or will have an input of its AND gate 656 connected to VDD. At step 708, if the POWERi result from the AND gate 656 of the last stage is at the high logic level, this indicates that all bits of the shifted first test word match those of the second test word and the power up test has passed, as indicated at step 710. If the data mismatches, then the system will wait for a predetermined period of time at step 712 before repeating the method at step 700.

The previously described power up detection method of FIG. 23 uses the power up test system 600 of FIG. 18. According to a further embodiment of the present invention, the test memory array 602 is integrated with a normal memory array, such as memory array 102 of FIG. 9. For example, two rows of skewed ROM cells having the same number of cells in a row of memory array 102 can be added anywhere in the memory array 102 and connected to the same bitlines. The dual function data register 108 can be slightly modified to further provide the data match operation described in the method of FIG. 23. This embodiment will minimize circuit overhead since many of the circuit elements in use for normal operations can be used for power up detection.

Figure 25:
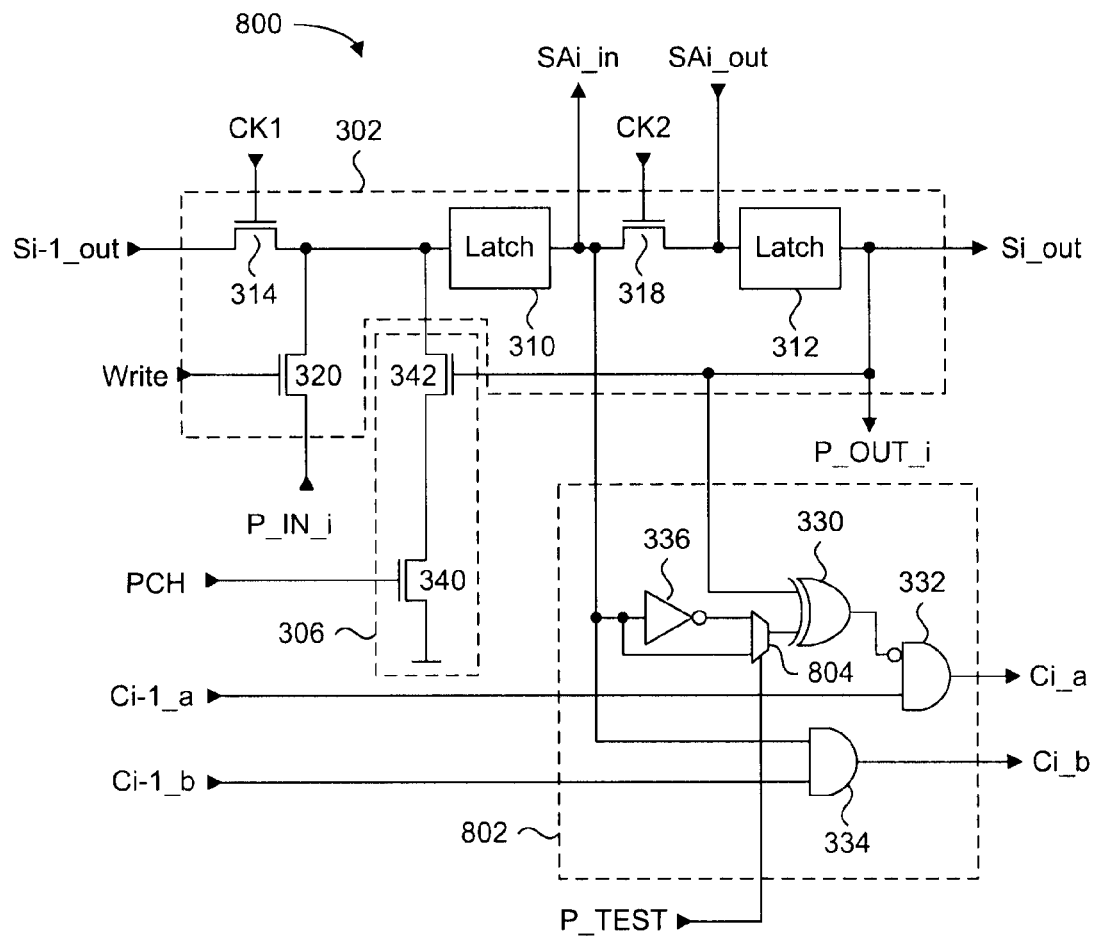

FIG. 25 is a circuit schematic of an alternate register stage of the dual function data register 108 shown in FIG. 10, according to an embodiment of the present invention. Register stage 800 is identically configured to register stage 300 shown in FIG. 12, except that status circuit 304 of FIG. 12 is replaced with modified status circuit 802 in the embodiment of FIG. 25. Hence the same circuit elements will have the same reference numerals. Modified status circuit 802 includes the same XOR logic gate 330, AND logic gate 332, AND gate 334 and inverter 336 of status circuit 304, but now includes a selector switch 804 positioned at an input of XOR logic gate 330. More specifically, selector switch 804 is implemented as a 2-to-1 multiplexor (MUX) having a first input terminal connected to an output of inverter 336, a second input terminal connected to the input of inverter 336, and an output connected to the input of XOR logic gate 330. Therefore, MUX 804 is controlled to pass either an inverted or non-inverted output of master latch 310 to XOR gate 330, in response to selection signal P_TEST.

In a normal mode of operation, ie. a program verify mode of operation, P_TEST will be at a first logic state to couple the output of inverter 336 to XOR gate 330. Accordingly, the functionality and operation of register stage 800 will be identical to that of register stage 300 of FIG. 12. In the power up mode of operation, P_TEST will be at a second logic state to couple the input of inverter 336 to XOR gate 330. Then the functionality and operation of register stage 800 will be identical to that of register stage 650 of FIG. 22. The last signal Cn_a can be monitored in order to determine if the data stored in the master latch 310 and the slave latch 312 of each register stage are identical.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A data register stage, comprising:
   a data storage circuit having a first latch and a second latch arranged in a master-slave flip-flop configuration for shifting in data serially from a serial input terminal and for shifting out data from a serial output terminal, the shifting operations being controlled by phase adjustable clock signals; and
   a status circuit for detecting opposite logic states stored in the first latch and the second latch, and for combining an output corresponding to the detected opposite logic states with a previous local status signal to provide a local status signal, the previous local status signal corresponding to detected opposite logic states stored in a previous data register stage.

2. The data register stage of claim 1, wherein the data storage circuit further includes a parallel data input circuit for coupling parallel data to an input of the first latch in response to a write signal, and a parallel data output terminal coupled to an output of the second latch.

3. The data register stage of claim 1, further including a program inhibit circuit for reversing the logic state stored in the first latch if the second latch stores a specific logic state.

4. The data register stage of claim 3, wherein the program inhibit circuit includes a first transistor and a second transistor serially connected between a voltage supply and an input of the first latch, the first transistor gate receiving an enable signal and the second transistor gate being coupled to an output of the second latch.

5. The data register stage of claim 1, wherein the status circuit includes an XOR gate for comparing the logic state of the second latch to an inverted logic state of the first latch, and an AND gate for combining the XOR gate output with the previous local status signal to provide the local status signal.

6. The data register stage of claim 1, wherein the status circuit further detects matching logic states stored in the first latch and another first latch of the previous data register stage for providing a second local status signal.

7. The data register stage of claim 6, wherein the status circuit includes an AND gate for combining the logic state of the first latch with a second previous local status signal corresponding to the logic state of a second first latch of the previous data register stage, for providing the second local status signal.

8. The data register stage of claim 1, wherein the first latch output is coupled to a sense amplifier input and the second latch input is coupled to a sense amplifier output.

9. The data register stage of claim 1, wherein the phase adjustable clock signals include first and second clock signals generated by a clock controller in response to a source clock and an active logic level of a shift enable signal.

10. The data register stage of claim 9, wherein the clock controller includes
    a first AND gate for generating the first clock signal in response to the source clock and the active logic level of the shift enable signal, and
    a second AND gate for generating the second clock signal in response to an inverted source clock and the active logic level of the shift enable signal.

11. A non-volatile memory device, comprising:
    a memory array having non-volatile memory cells connected to wordlines and bitlines;
    bitline sense amplifiers coupled to the columns for biasing the bitlines in response to program data in a program operation and for sensing a read voltage of the bitlines in a read operation to provide read data; and
    a data register for concurrently storing the program data and the read data, the data register comparing the stored program data to the stored read data and providing a status signal corresponding to a successful program operation when the stored program data and the stored read data are opposite logic levels.

12. The non-volatile memory device of claim 11, wherein the data register includes a first register stage and a second register stage serially connected to each other for serially shifting one of the program data and the read data through a serial output port coupled to the second register stage.

13. The non-volatile memory device of claim 12, wherein the first register stage and the second register stage each include:
    a data storage circuit having a first latch and a second latch arranged in a master-slave flip-flop configuration for shifting in data serially from a serial input terminal and for shifting out data from a serial output terminal, the shifting operations being controlled by phase adjustable clock signals, and
    a status circuit for detecting opposite logic states stored in the first latch and the second latch, and for combining an output corresponding to the detected opposite logic states with a previous local status signal to provide a local status signal, the previous local status signal corresponding to detected opposite logic states stored in a previous data register stage.

14. The non-volatile memory device of claim 13, further including a clock controller for generating the phase adjustable clock signals in response to a source clock and a shift enable signal, the program data being shifted out through the serial output port when the shift enable signal is activated while the source clock is at a first logic level, and the read data being shifted out through the serial output port when the shift enable signal is activated while the source clock is at a second logic level.

15. The non-volatile memory device of claim 13, wherein the data storage circuit further includes a parallel data input circuit for coupling parallel data to an input of the first latch in response to a write signal, and a parallel data output terminal coupled to an output of the second latch.

16. The non-volatile memory device of claim 13, wherein the status circuit includes a data match circuit for detecting opposite logic states stored in the first latch and the second latch, the data match circuit including,
   an XOR gate for comparing the logic state of the second latch to an inverted logic state of the first latch, and
   an AND gate for combining the XOR gate output with the previous local status signal to provide the local status signal.

17. The non-volatile memory device of claim 16, further including a program inhibit circuit for changing the logic state stored in the first latch to a program inhibit logic state if the second latch stores read data corresponding to a successfully programmed memory cell.

18. The non-volatile memory device of claim 17, wherein the status circuit includes a reprogram verify circuit for providing a second local status signal when the first latch and a previous second local status signal have logic states corresponding to the program inhibit logic state, the previous second local status signal being provided by the previous data register stage.

19. The non-volatile memory device of claim 18, wherein the data register includes program verify logic for providing the status signal corresponding to a successful program operation when the local status signal is at a logic level corresponding to the detected opposite logic states.

20. The non-volatile memory device of claim 18, wherein the data register includes program verify logic for providing the status signal corresponding to a successful program operation when the second local status signal is at a logic level corresponding to the program inhibit logic state.

21. The non-volatile memory device of claim 18, wherein the data register includes program verify logic for providing the status signal corresponding to a successful program operation when the local status signal is at a logic level corresponding to the detected opposite logic states and the second local status signal is at a logic level corresponding to the program inhibit logic state.

22. The non-volatile memory device of claim 17, wherein the program inhibit circuit includes a first transistor and a second transistor serially connected between a voltage supply and an input of the first latch, the first transistor gate receiving an enable signal and the second transistor gate being coupled to an output of the second latch.

23. The non-volatile memory device of claim 18, wherein the reprogram verify circuit includes an AND gate for combining the logic state of the first latch with the previous second local status signal to provide the second local status signal.

* * * * *